US012812829B2

(12) United States Patent
Li

(10) Patent No.: US 12,812,829 B2
(45) Date of Patent: Nov. 24, 2026

(54) DISPLAY DEVICE HAVING SUPPORTING PLATFORM ON BEZEL

(71) Applicant: WUHAN TIANMA MICROELECTRONICS CO., LTD., Wuhan (CN)

(72) Inventor: Qingliang Li, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 127 days.

(21) Appl. No.: 18/644,122

(22) Filed: Apr. 24, 2024

(65) Prior Publication Data

US 2024/0276689 A1 Aug. 15, 2024

(30) Foreign Application Priority Data

Sep. 12, 2023 (CN) ......................... 202311175307.0

(51) Int. Cl.
*H05K 9/00* (2006.01)
*H05K 5/02* (2006.01)
*H05K 5/03* (2006.01)

(52) U.S. Cl.
CPC ......... *H05K 9/0054* (2013.01); *H05K 5/0217* (2013.01); *H05K 5/03* (2013.01)

(58) Field of Classification Search
CPC ...... H05K 9/0054; H05K 5/0217; H05K 5/03; G06F 1/1637
See application file for complete search history.

(56) References Cited

U.S. PATENT DOCUMENTS

2012/0242926 A1* 9/2012 Hsu ...................... G02B 6/0001 349/58
2013/0135830 A1 5/2013 Lai et al.
(Continued)

FOREIGN PATENT DOCUMENTS

CN 102855816 A 1/2013
CN 111105708 A 5/2020
(Continued)

OTHER PUBLICATIONS

Machine translation of CN116030714A (Year: 2026).*
(Continued)

*Primary Examiner* — Sagar Shrestha
(74) *Attorney, Agent, or Firm* — KILPATRICK TOWNSEND & STOCKTON LLP

(57) ABSTRACT

A display device, comprising a display component and a middle frame bezel. The display component includes a cover plate, a display module, and an encapsulating layer. The cover plate has a light-emitting side of and a backlight side which are opposite, the display module and at least a part of the encapsulating layer is disposed at the backlight side of the cover plate. The encapsulating layer covers at least a part of a periphery of the display module. A supporting platform is disposed on at least a part of a periphery of the middle frame bezel and configured to support the display module. The supporting platform is located at a side of the display module away from the cover plate, and the supporting platform and the display module overlap in a first overlapping region when viewed along a thickness direction of the cover plate.

50 Claims, 27 Drawing Sheets

(56) References Cited

U.S. PATENT DOCUMENTS

| | | | | |
|---|---|---|---|---|
| 2018/0196300 | A1* | 7/2018 | Jung | G02F 1/133308 |
| 2020/0133344 | A1 | 4/2020 | Park et al. | |
| 2020/0196496 | A1* | 6/2020 | Shin | G06F 1/16 |
| 2021/0405688 | A1* | 12/2021 | Barrett | G09F 9/301 |
| 2022/0061166 | A1* | 2/2022 | Burke | G06F 1/1656 |
| 2022/0272849 | A1* | 8/2022 | Pandya | H04M 1/0202 |
| 2022/0312607 | A1* | 9/2022 | Bass | G02B 6/0006 |
| 2022/0317355 | A1* | 10/2022 | Luo | H10K 59/873 |
| 2023/0254961 | A1* | 8/2023 | Zhu | G06F 1/1637<br>361/220 |
| 2024/0306324 | A1* | 9/2024 | Su | G02F 1/133317 |
| 2025/0298434 | A1* | 9/2025 | Kakuda | G06F 1/181 |

FOREIGN PATENT DOCUMENTS

| | | | |
|---|---|---|---|
| CN | 115995187 | A | 4/2023 |
| CN | 116030714 | A | 4/2023 |
| KR | 20190078842 | A1 | 7/2019 |

OTHER PUBLICATIONS

Machine translation of CN113421900A (Year: 2026).*
Office Action of CN Patent Application No. 202311175307.0 Dated Apr. 30, 2025.

* cited by examiner

DISPLAY DEVICE HAVING SUPPORTING PLATFORM ON BEZEL

The present disclosure claims the priority to Chinese Patent Application No. 202311175307.0, titled "DISPLAY DEVICE", filed on Sep. 12, 2023 with the China National Intellectual Property Administration, the content of which is incorporated herein by reference.

FIELD

The present disclosure relates to the field of display technology, and in particular to a display device.

BACKGROUND

Development of display technology renders increasingly wide application of display devices, which are being indispensable in people's daily work and life. Requirements on a display area and a border width of display devices are thus growing strict. How to reduce an area of a border region of the display device becomes a research hotspot.

SUMMARY

Embodiments of the present disclosure is capable to reduce an area of a border region of a display device, i.e., achieve a narrow frame.

A display device is provided according to embodiments of the present disclosure. The display device includes a display component and a middle frame bezel.

The display component includes a cover plate, a display module, and an encapsulating layer. The cover plate has a light-emitting side of and a backlight side which are opposite, the display module is disposed at the backlight side of the cover plate, and at least a part of the encapsulating layer is disposed at the backlight side of the cover plate. The encapsulating layer covers at least a part of a periphery of the display module. The display module includes a display panel, a supporting layer, and a composite layer which are stacked. The composite layer includes multiple functional layers. The display panel includes a bending portion at a side of the display panel along a first direction, and the first direction is parallel with a plane along which the cover plate extends.

A supporting platform is disposed on at least a part of a periphery of the middle frame bezel and configured to support the display module. The supporting platform is located at a side of the display module away from the cover plate, and the supporting platform and the display module overlap in a first overlapping region when viewed along a thickness direction of the cover plate.

Herein the supporting platform and the display module in the display device overlap with each other in the first overlapping region when viewed along the thickness direction of the cover plate. Such partial overlapping reduces a distance between an end of the display module facing the middle frame bezel and a surface of the middle frame bezel facing the display module in a plane parallel to the cover plate, and to reduce a distance between the end of the display module facing the middle frame bezel and a side surface of the middle frame bezel facing away from the display module. Thus, a border region of the display device has a smaller area in the plane parallel to the cover plate, which facilitate a narrow border in display.

BRIEF DESCRIPTION OF THE DRAWINGS

Hereinafter drawings to be applied in embodiments of the present disclosure or in conventional technology are briefly described, in order to clarify illustration of the embodiments of the present disclosure or in conventional technology. Apparently, the drawings in the following descriptions are only some embodiments of the present disclosure.

DETAILED DESCRIPTION OF EMBODIMENTS

Hereinafter the embodiments of the present disclosure are described clearly and completely in conjunction with the drawings in embodiments of the present closure. Apparently, the described embodiments are only some rather than all of the embodiments of the present disclosure.

Hereinafter various details are set forth in description to facilitate a full understanding of the present disclosure. The present disclosure may be implemented in other ways different from those described herein. Those skilled in the art may make derivation without departing from the connotation of the present disclosure. Therefore, the present disclosure is not limited to embodiments as disclosed below.

As described in the background, how to reduce an area of a border region of a display panel has become a research hotspot in the field.

At present, a display device may include a middle frame bezel and a display component. The display component may include a cover plate and a display module, and the display module is located at a backlight side of the cover plate. In practice, the display component is mounted on the middle frame bezel through overlap joint between the cover and the middle frame bezel plate, and the display device is assembled.

Figure 1:
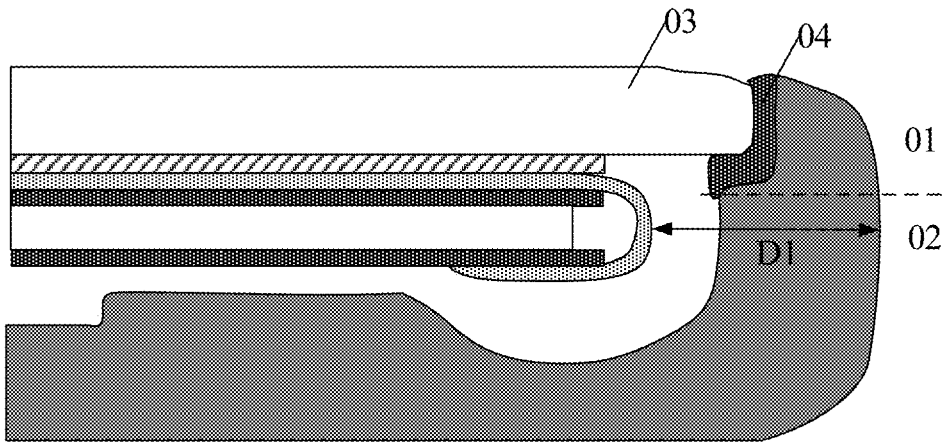
FIG. 1 is a schematic sectional view of a part of a display device.

As shown in FIG. 1, the middle frame bezel may include a first portion 01 and a second portion 02 sequentially arranged along a direction perpendicular to a plane in which the display device extends. An inner diameter of the first portion 01 is larger than an inner diameter of the second portion 02, and a stepped surface is formed at a boundary region between the first portion 01 and the second portion 02. A cover plate 03 is disposed on the stepped surface via a caulking glue 04 in an overlapping manner, and thereby is mounted onto the middle frame bezel. In the foregoing assembly, there is a large distance D1 between an end of the display component facing the middle frame bezel and a side surface of the middle frame bezel facing away from the display component, which results in a large a border region of the display device. Accordingly, a black border corresponding to the border region is large in the display device, which hampers user experience.

Figure 2:
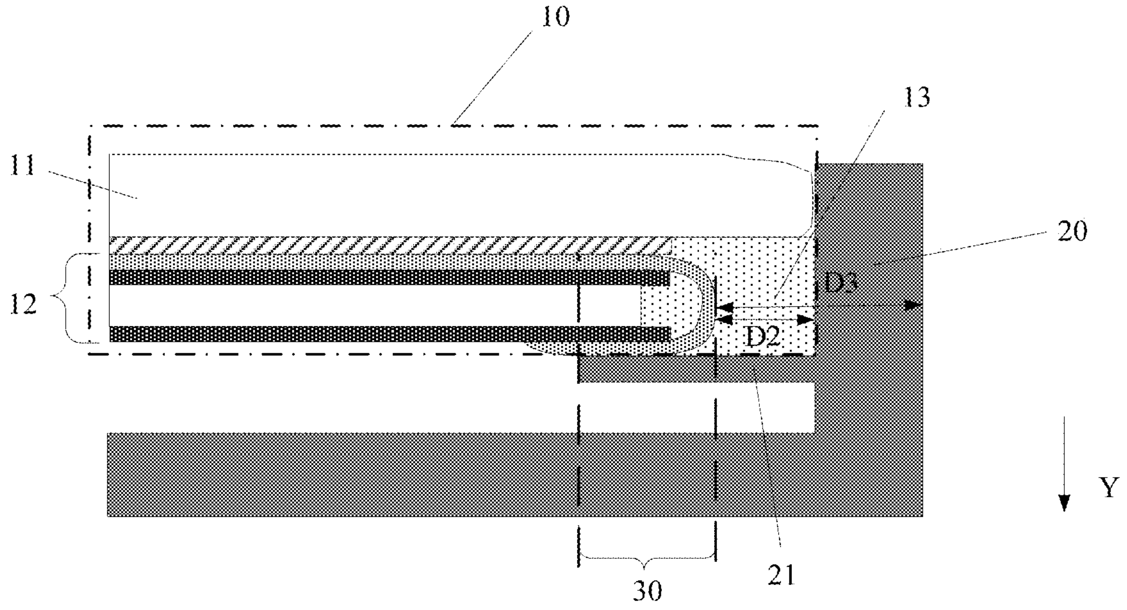
FIG. 2 is a schematic sectional view of a part of a display device according to an embodiment of the present disclosure.

In order to address at least the foregoing issue, a display device is provided according to an embodiment of the present disclosure. As shown in FIG. 2, the display device includes a display component 10 and a middle frame bezel 20.

The display component 10 includes a cover plate 11, a display module 12, and an encapsulating layer 13. The cover plate 11 has a light-emitting side of and a backlight side which are opposite, the display module 12 is disposed at the backlight side of the cover plate 11, and at least a part of the encapsulating layer 13 is disposed at the backlight side of the cover plate 11. The encapsulating layer 13 covers at least a part of a periphery of the display module 12.

A supporting platform 21 is disposed on at least a part of a periphery of the middle frame bezel 20 and configured to support the display module. The supporting platform 21 is located at a side of the display module 12 away from the cover plate 11, and the supporting platform 21 and the display module 12 overlap in a first overlapping region when viewed along a thickness direction Y of the cover plate 11.

In an embodiment, the cover plate 11 is a glass cover plate. The encapsulating layer 13 includes a solidified glue, i.e., is formed by curing a glue. The present disclosure is not limited thereto, and one embodiment may depend on an actual situation.

In an embodiment, a part of the encapsulating layer 13 may be disposed at the backlight side of the cover plate, or the whole encapsulating layer 13 may be disposed at the backlight side of the cover plate. Similarly, the encapsulating layer may be located at a part of the periphery of the display module, or may be located throughout the whole periphery of the display module. The present disclosure is not limited thereto, and one embodiment may depend on an actual situation.

Herein the supporting platform and the display module in the display device overlap with each other in the first overlapping region when viewed along the thickness direction of the cover plate. Such partial overlapping reduces a distance D2 between an end of the display module facing the middle frame bezel and a surface of the middle frame bezel facing the display module in a plane parallel to the cover plate, and thereby reduces a distance D3 between the end of the display module facing the middle frame bezel and a side surface of the middle frame bezel facing away from the display module. Thus, a border region of the display device has a smaller area in the plane parallel to the cover plate, which facilitate a narrow border in display.

In an embodiment on a basis of the foregoing embodiments, a ratio of a length of the first overlapping region 30 to a length of the supporting platform 21 along a first direction X ranges from 0.1 to 0.4. In one embodiment, a gap between the middle frame bezel 20 and the display module 12 would neither be too small, in which case the display module 12 is likely to be damaged due to wagging in the middle frame bezel 20, or too large, in which case the display device is restrained from a narrow border due to a large border region.

In an embodiment, the ratio of the length of the first overlapping region 30 to the length of the supporting platform 21 along the first direction X ranges from 0.15 to 0.3. In one embodiment, a better balance is achieved between the protection of the display module 12 against wagging in the middle frame 20 and the implementation of the narrow border of the display device.

In an embodiment, a length of the first overlapping region 30 along the first direction X is not less than 0.5 mm. In one embodiment, the supporting platform 21 can achieve a firm support for the display module 12.

In an embodiment, the length of the first overlapping region 30 along the first direction X is not less than 0.8 mm. In one embodiment, the supporting platform 21 can achieve a firmer support for the display module 12.

Figure 3:
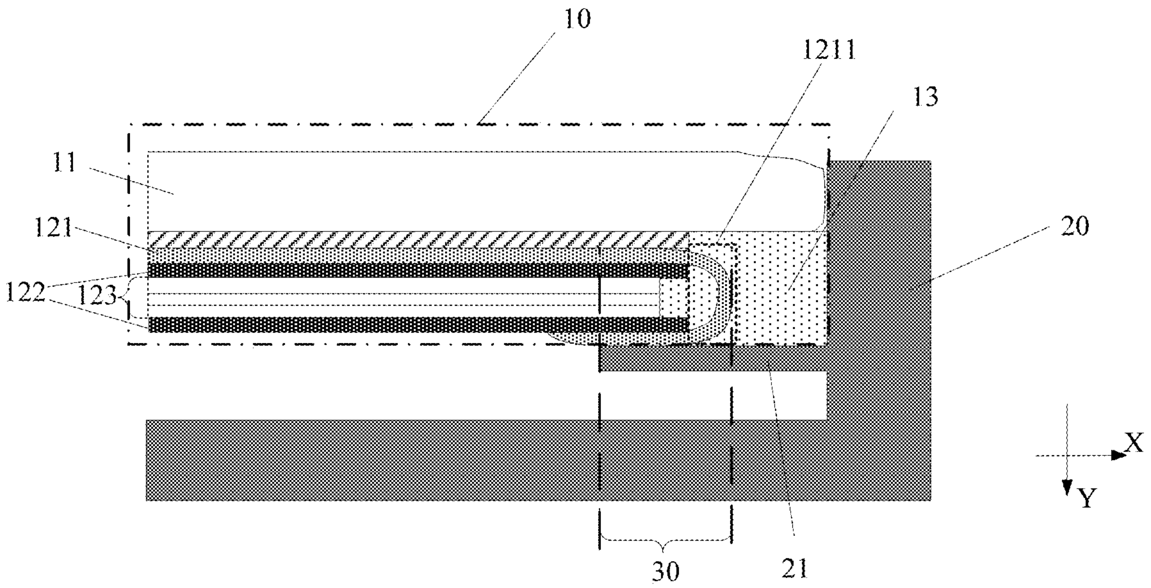
FIG. 3 is a schematic sectional view of a part of a display device according to another embodiment of the present disclosure.

In an embodiment, as shown in FIG. 3, the display module includes a display panel 121, a supporting layer 122 and a composite layer 123, which are stacked. The composite layer 123 may include multiple functional layers. The display panel 121 includes a bending portion 1211 at a side of the display panel 121 along a first direction X. The first direction X is parallel to a reference plane in which the cover plate 11 extends (or, a reference plane parallel to the cover plate), that is, is perpendicular to the thickness direction Y of the cover plate 11.

Figure 4:
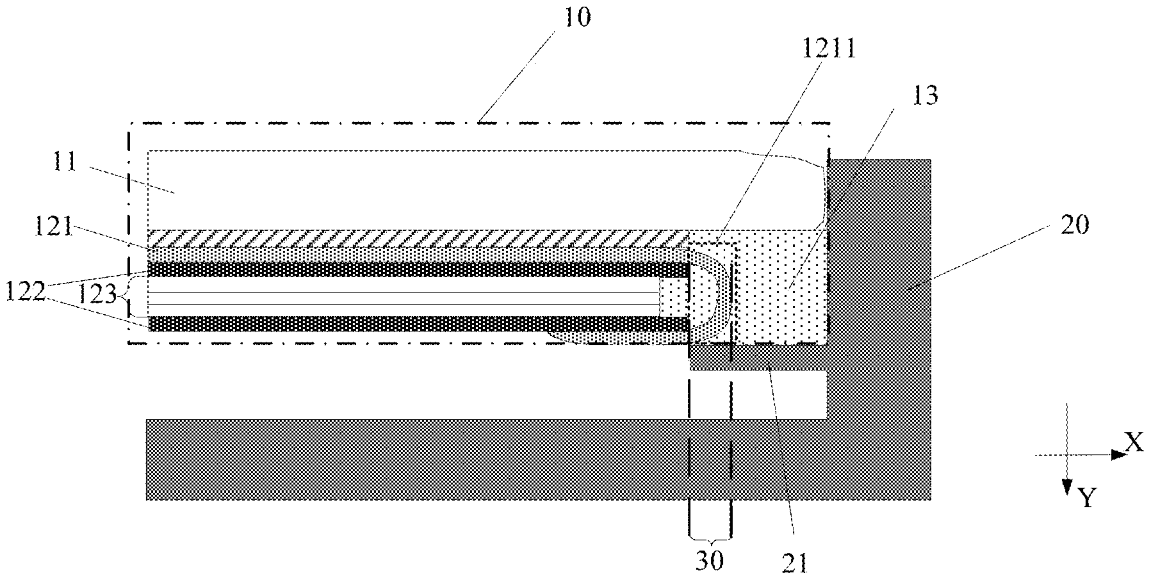
FIG. 4 is a schematic sectional view of a part of a display device according to another embodiment of the present disclosure.

In an embodiment, as shown in FIG. 4, the supporting platform 21 overlaps with the bending portion 1211 of the display panel 121, and do not overlap with the composite layer 123 or the supporting layer 122, when viewed along the thickness direction Y. In one embodiment, a short portion of the supporting platform 21 is disposed at the backlight side of the display module 12, which provides more space for disposing internal component(s) of the display device. In such case, an overlapping region between the supporting platform 21 and the bending portion 1211 overlap serves as the first overlapping region 30.

In another embodiment, as shown in FIG. 3, the supporting platform 21 not only overlaps with the bending portion 1211 of the display panel 121, but also overlaps with the composite layer 123 and/or the supporting layer 122, when viewed along the thickness direction Y. In one embodiment, a long portion of the supporting platform 21 is disposed at the backlight side of the display module 12. A distance between the end of the display module facing the middle frame bezel and a side surface of the middle frame bezel facing the display module within the reference plane is reduced, and thus the distance between the end of the display module facing the middle frame bezel and the side surface of the middle frame bezel facing away from the display module is also reduced. The border region of the display device in the reference plane is reduced to achieve a narrow border. In such case, an overlapping region between supporting platform 21 and the bending portion 1211 and an overlapping region between the supporting platform 21 and the composite layer 123 and/or the supporting layer 122 together serve as the first overlapping region 30.

Figure 5:
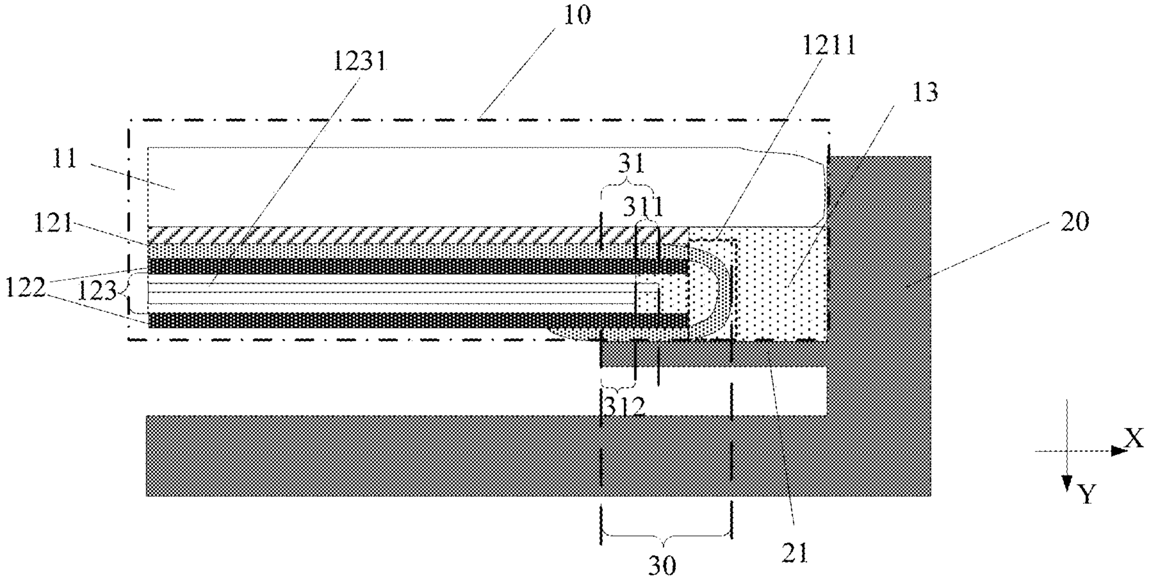
FIG. 5 is a schematic sectional view of a part of a display device according to another embodiment of the present disclosure.

In an embodiment, as shown in FIGS. 3 and 5, a length of the composite layer 123 is smaller than a length of the supporting layer 122 along the first direction X. In an embodiment, the supporting platform 21 and the composite layer 123 may overlap in a second overlapping region 31. On a basis of reducing the area of the border region of the display device is to achieve a narrow border, the supporting platform 21 is configured to provide support for the composite layer 123 along the thickness direction Y, which improves robustness of the display module in the thickness direction Y. The present disclosure is not limited thereto, and one embodiment may depend on an actual situation.

In the foregoing embodiments, the multiple functional layers in the composite layer may have identical dimensions along the first direction, as shown in FIG. 3, or may have different dimensions along the first direction, as shown in FIG. 5. In an embodiment, the second overlapping region may be implemented through that the supporting platform 21 overlaps with at least one functional layer in the composite layer 123 when viewed along the thickness direction Y of the cover plate 11. In one embodiment, the supporting platform 21 overlaps with the composite layer 123.

In an embodiment, the functional layers in the composite layer 123 includes a first functional layer 1231, which is a longest functional layer among the functional layers along the first direction X. That is, a distance between the first functional layer 1231 and an arc top of the bending portion 1211 is smaller than a distance between other functional layer(s) in the composite layer 123 and the arc top of the bending portion 1211.

Figure 6:
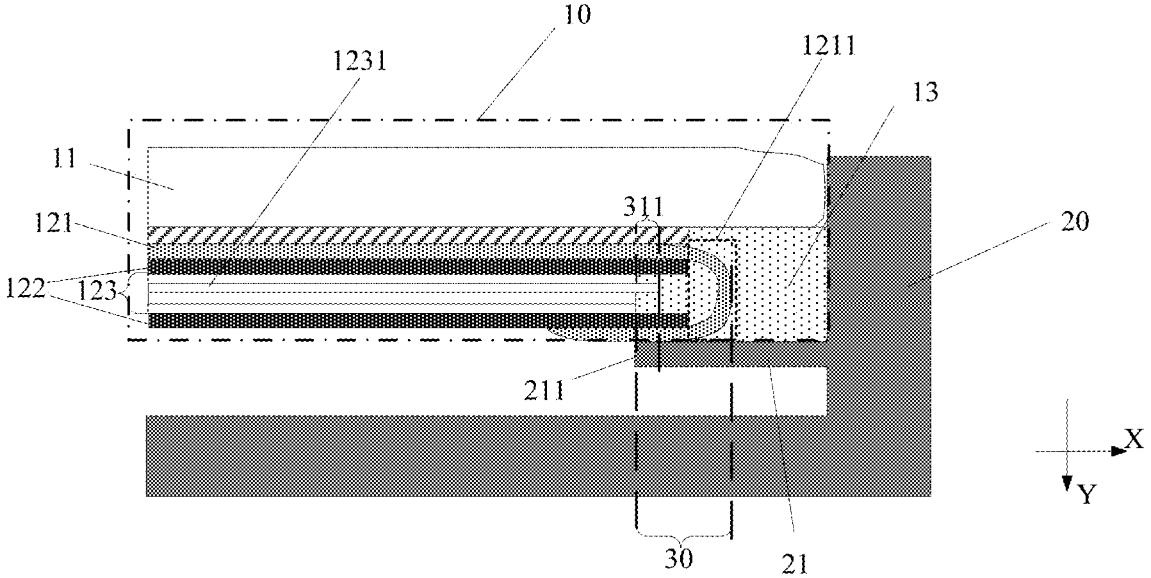
FIG. 6 is a schematic sectional view of a part of a display device according to another embodiment of the present disclosure.

In an embodiment, as shown in FIG. 6, the supporting platform 21 overlaps with only the first functional layer 1231 in the composite layer 123, and there is an overlapping region 311 between the two. In one embodiment, both a support strength of the supporting platform 21 for the display module 12 and an occupied space of the supporting platform 21 inside the display device are considered. In another embodiment, as shown in FIG. 5, the supporting platform 21 not only overlaps with the first functional layer 1231 in the overlapping region 311, but also overlaps with other functional layer(s) in an overlapping region 312, when viewed along the thickness direction Y. In one embodiment, the supporting platform 21 provides a firmer support for the display module 12, and robustness of the display module 12 in the thickness direction Y is improved. The present disclosure is not limited thereto, and one embodiment may depend on an actual situation.

In an embodiment, as shown in FIG. 5, the supporting platform 21 overlaps partially with at least two functional layers in the composite layer 123 when viewed along the thickness direction Y. In one embodiment, more functional layers overlapping with the supporting platform 21 can enhance support strength of the supporting platform 21 for the display module 12, and the robustness of the display module 12 in the thickness direction Y of the cover plate 11 is further improved. The present disclosure is not limited thereto, and one embodiment may depend on an actual situation.

In an embodiment, a length of the second overlapping region 31 ranges from 0.2 mm to 0.4 mm along the first direction X. In one embodiment, the supporting platform 21 can have a good support for the composite layer 123, and the robustness of the display module 12 in the thickness direction Y is improved. The present disclosure is not limited thereto, and one embodiment may depend on an actual situation.

In an embodiment, as shown in FIG. 6, a terminal 211 of the supporting platform 21 points away from the middle frame bezel 20, and the bending portion 1211 is located between the middle frame bezel 20 and the terminal 211 along the first direction X. That is, a projection of the bending portion 1211 on the reference plane is within a projection of the supporting platform 21 on the reference plane. On a basis of reducing the area of the border region of the display device to achieve the narrow border, a support function of the supporting platform 21 for the bending portion 1211 is further improved, and the robustness of the bending portion 1211 in the thickness direction is improved.

In an embodiment, as shown in FIG. 6, the terminal 211 is located at a side of the bending portion 1211 away from the middle frame bezel 20 along the first direction. In one embodiment, a support effect of the supporting platform 21 for the bending portion 1211 is ensured. In another embodiment, as shown in FIG. 4, the terminal 211 is aligned with a terminal of the bending portion 1211 away from the middle frame bezel 20 when viewed along the thickness direction Y. In one embodiment, a length of the supporting platform 21 along the first direction X is reduced while ensuring a support effect of the supporting platform 21 for the bending portion 1211. The present disclosure is not limited thereto, and one embodiment may depend on an actual situation.

Figure 7:
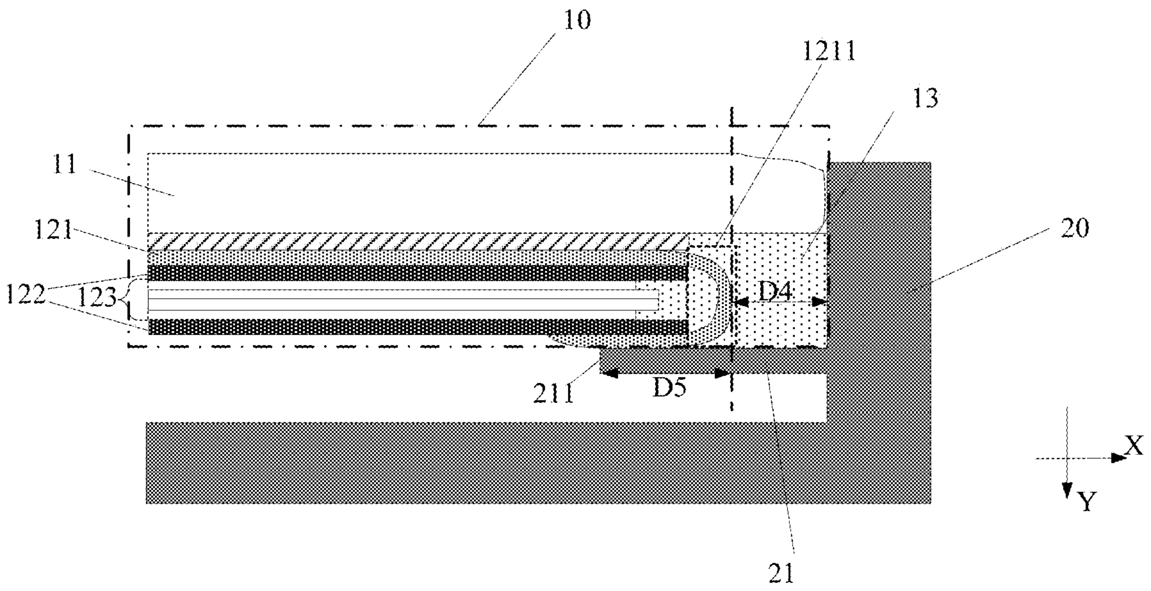
FIG. 7 is a schematic sectional view of a part of a display device according to another embodiment of the present disclosure.
Figure 8:
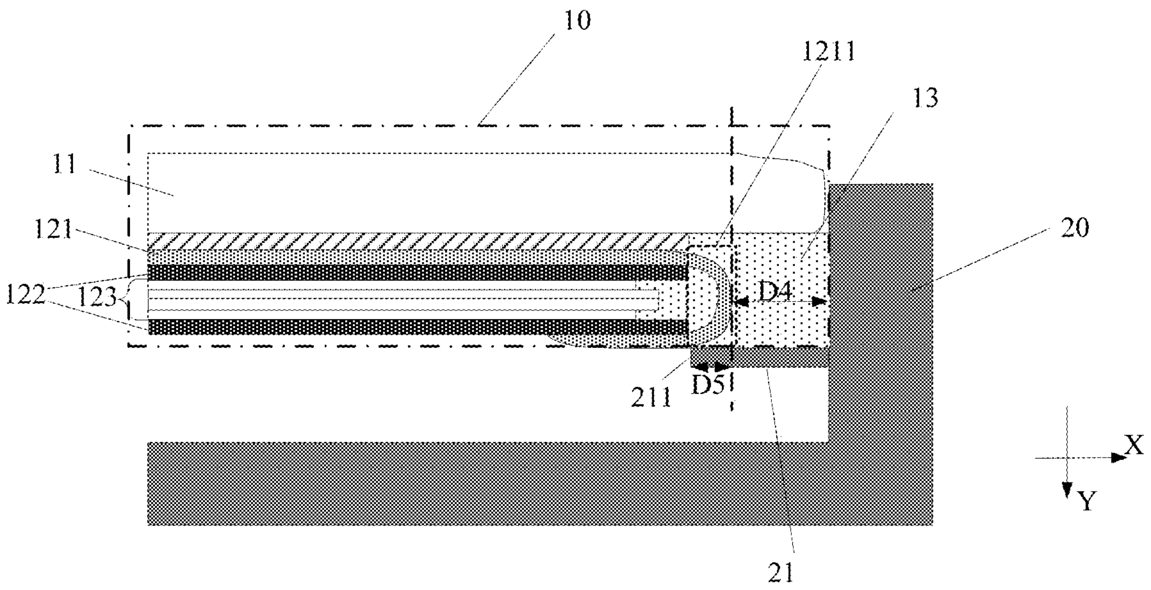
FIG. 8 is a schematic sectional view of a part of a display device according to another embodiment of the present disclosure.

In an embodiment, as shown in FIG. 7, the bending portion 1211 has an arc top, and a distance D4 between the arc top and a side surface of the middle frame bezel 20 facing the bending portion 1211 is smaller than a distance D5 between the arc top and the terminal 211 along the first direction. In one embodiment, the supporting platform 21 provides a firmer support for the display module 12. The present disclosure is not limited thereto. In another embodiment, as shown in FIG. 8, the bending portion 1211 has the arc top, and the distance D4 is greater than the distance D5. In such case, a shorter supporting platform 21 along the first direction X is provided, which reduces spatial occupation of the supporting platform 21 in the display device. One embodiment may depend on an actual situation.

In an embodiment, the composite layer includes at least one of a metal layer, an adhesive layer, a copper foil, a foam layer, and a graphite layer, which is not limited herein. One embodiment may depend on a function of the composite layer in the display device.

Figure 9:
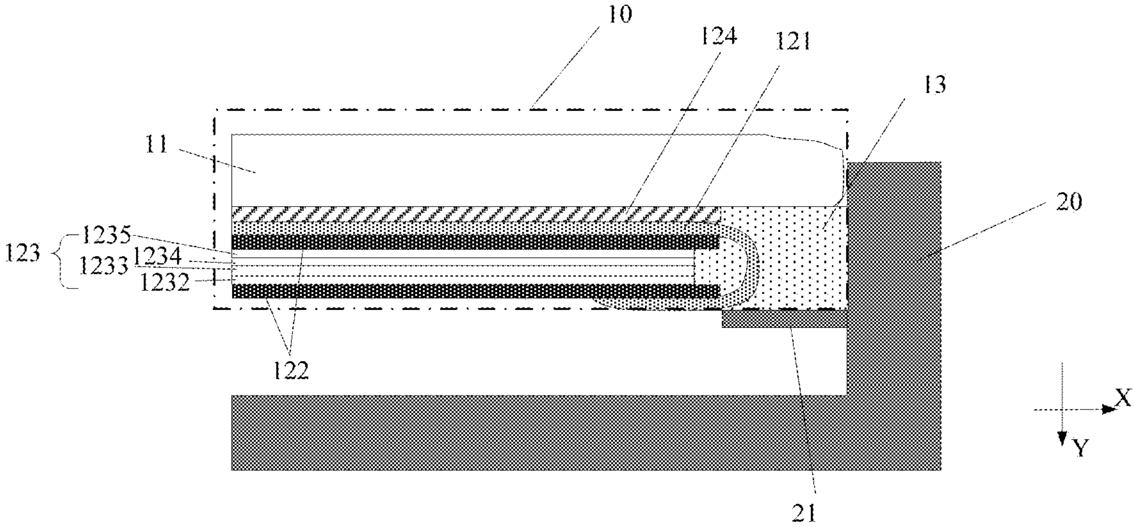
FIG. 9 is a schematic sectional view of a part of a display device according to another embodiment of the present disclosure.
Figure 10:
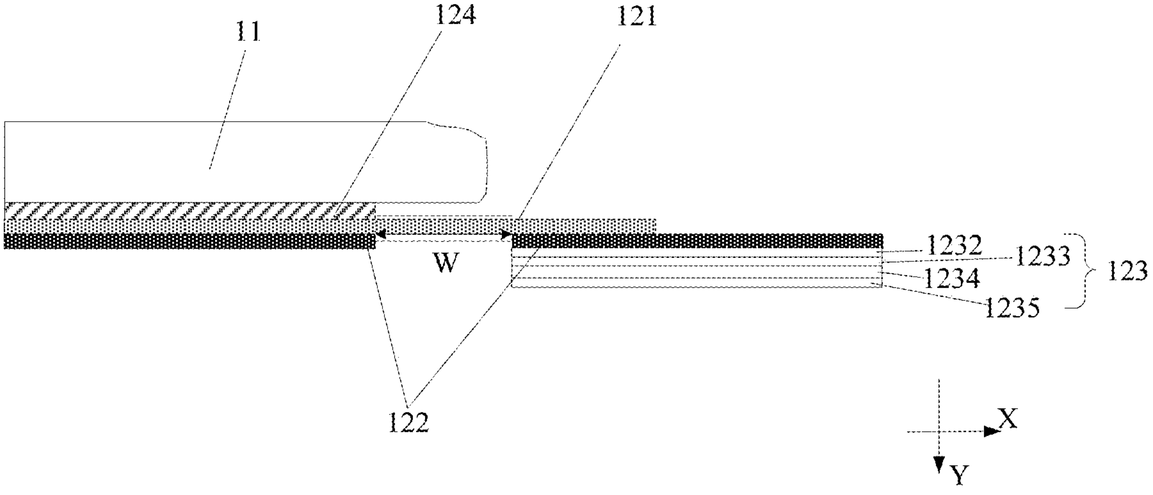
FIG. 10 is a schematic view of a unfolded display component in a display device as shown in FIG. 9 according to another embodiment of the present disclosure.

Reference is made to FIGS. 9 and 10, where FIG. 10 is a schematic view of the display component 10 as shown in FIG. 9 when being unfolded. In an embodiment, the composite layer 123 includes a copper foil 1232, a foam layer 1233, a graphite layer 1234, and a double-sided adhesive layer 1235, which are stacked along the thickness direction Y. The copper foil 1232 is configured to provide strengthening and protection, the foam layer 1233 is configured to provide cushion, the graphite layer 1234 is configured to heat dissipation, and the double-sided adhesive layer 1235 is configured to bonding the graphite layer 1234 with the supporting layer 122.

In an embodiment, along the thickness direction Y, a thickness of the copper foil is 0.05 mm, a thickness of the foam layer is 0.1 mm, a thickness of the graphite layer is 0.02 mm, and a thickness of the double-sided adhesive layer is 0.03 mm. In a case that the display component is unfolded to be flat along the first direction X, a width W of the bending portion along the first direction X is 1 mm. The present disclosure is not limited thereto, and one embodiment may depend on an actual situation.

Figure 11:
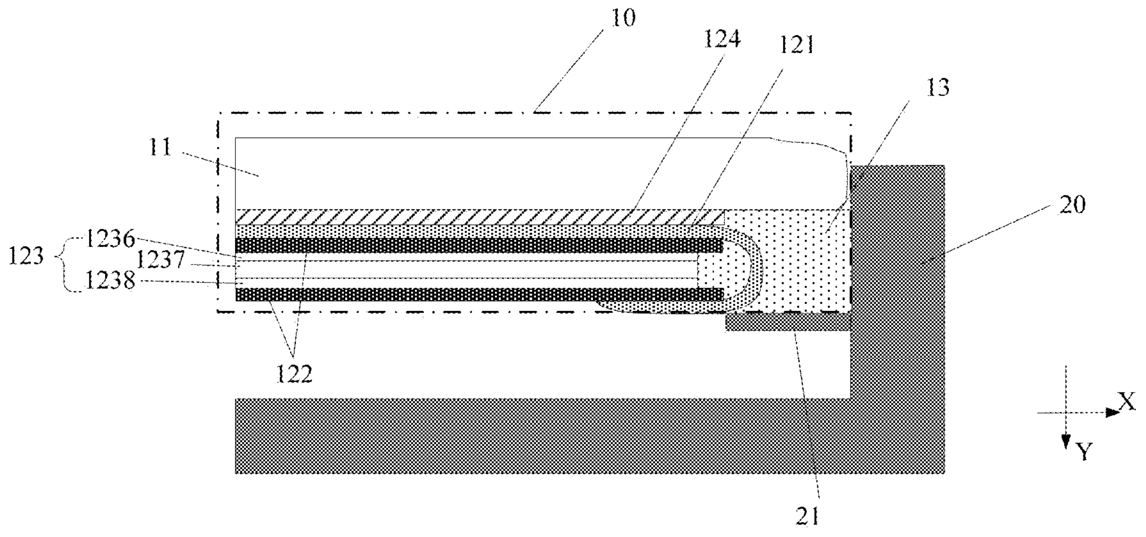
FIG. 11 is a schematic sectional view of a part of a display device according to another embodiment of the present disclosure.

In another embodiment, as shown in FIG. 11, the composite layer 123 includes a stainless steel plate 1236, a graphite layer 1237 and a thin film 1238, which are stacked along the thickness direction Y. The stainless steel plate 1236 is configured to provide strengthening and protection, the graphite layer 1237 is configured for heat dissipation, and the thin film 1238 is configured to absorb a portion of electromagnetic waves emitted from the display panel 121. In one embodiment, interferences of the electromagnetic waves emitted from the display panel on radio-frequency signals of the display device are reduced.

In an embodiment, as shown in FIGS. 9 and 11, the display component further includes a polarizer 124 disposed between the display panel 121 and the cover plate 11. The polarizer is configured to modulate ambient light irradiating on the display device, to reduce interferences of the ambient light.

In an embodiment, the bending portion 1211 has the arc top, and there is a first distance between the arc top and the middle frame bezel 20 along the first direction X. The first distance may refer to the distance D4 as shown in FIG. 8. The first distance may be configured between 0.3 mm and 0.6 mm, i.e., D4 ranges from 0.3 mm to 0.6 mm. In one embodiment, the display device can have a narrow border while protecting the art top against damages due to wagging in the middle frame bezel along the first direction under force. The present disclosure is not limited thereto, and one embodiment may depend on an actual situation.

In an embodiment, as shown in FIG. 8, a terminal of the encapsulating layer 13 away from the bending portion 1211 abut against a side surface the middle frame bezel 20 facing the bending portion 1211. In one embodiment, a position of the encapsulating layer 13 is fixed along the first direction X, and the encapsulating layer 13 is less likely to wag. In one embodiment the arc top of the bending portion 1211 is less likely to be damaged due to the wagging of the encapsulating layer 13.

In an embodiment, a material of the encapsulating layer 13 includes an adhesive (e.g., a glue), and the encapsulating layer is formed through curing the adhesive. In one embodiment, the encapsulating layer has a level of flexibility, and the encapsulating layer is capable to buffer a force on the arc top of the bending portion when the middle frame bezel is under an impact. The arc top of the bending portion are less like to be damaged.

In an embodiment, the encapsulating layer is fabricated through low-injection pressure over-molding (LIPO), and a shape of the encapsulating layer can be tuned for better attachment to the side surface of the middle frame bezel 20 facing the bending portion 1211. The present disclosure is not limited thereto, and one embodiment may depend on an actual situation.

Figure 12:
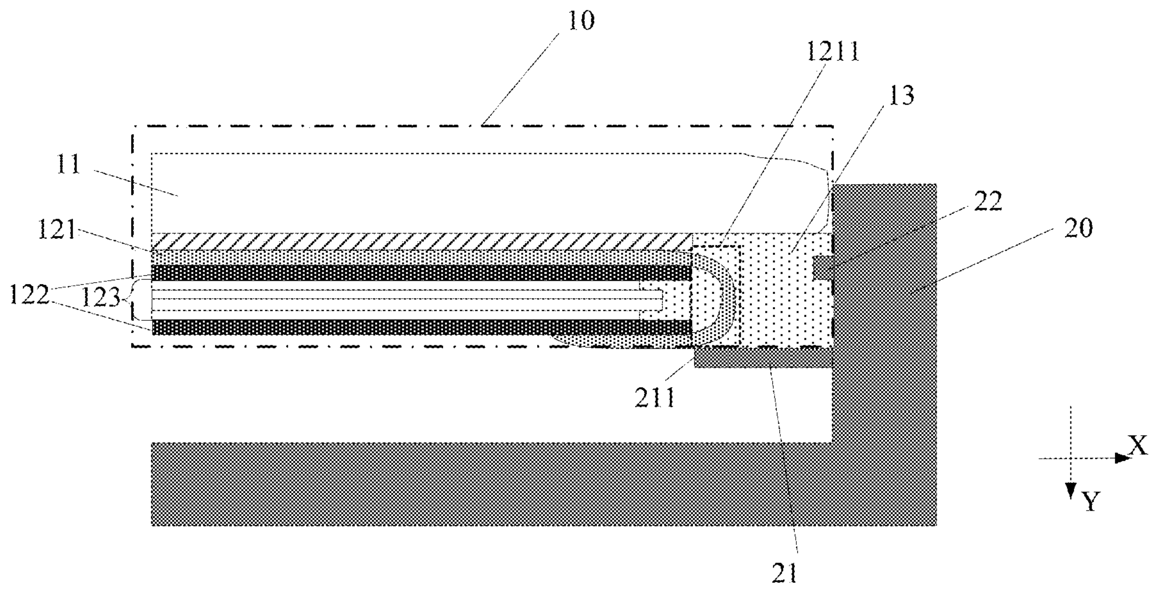
FIG. 12 is a schematic sectional view of a part of a display device according to another embodiment of the present disclosure.

Reference is made to FIG. 12. In an embodiment, at least one reinforcing member 22 is disposed at a side surface of the middle frame bezel 20 facing the bending portion 1211. The reinforcing member is configured to strengthen engagement between such side surface of the middle frame bezel 20 and a side surface of the encapsulating layer 13 facing away from the bending portion 1211. In one embodiment, a relative position between the middle frame bezel 20 and the encapsulating layer 13 is more stable.

Figure 13:
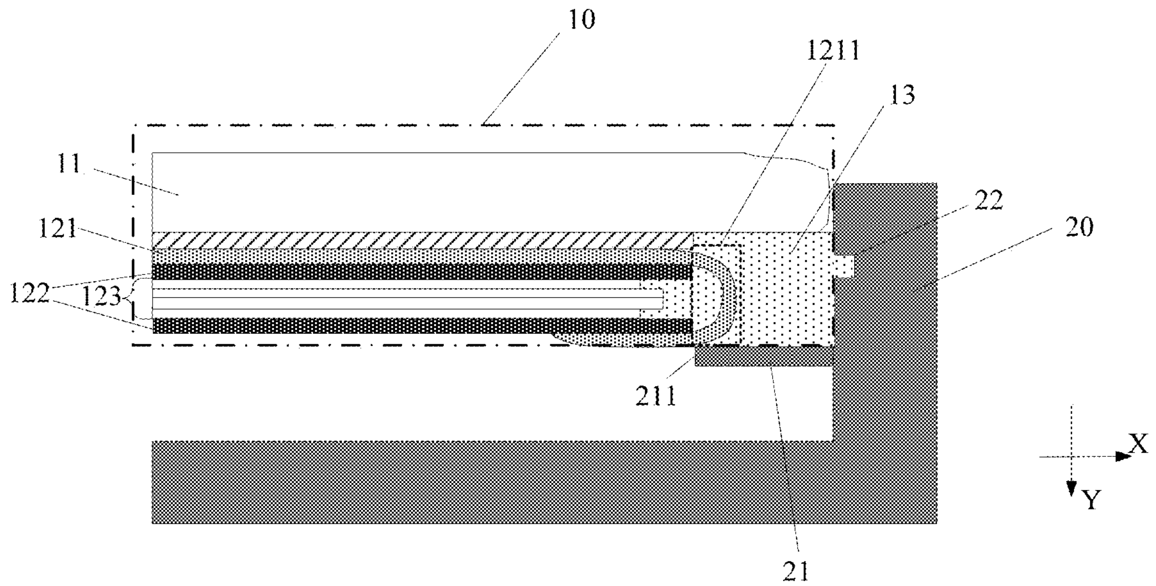
FIG. 13 is a schematic sectional view of a part of a display device according to another embodiment of the present disclosure.

In an embodiment, as shown in FIG. 12, the reinforcing member 22 is a protrusion, and correspondingly a recess is provided at the side surface of the encapsulating layer 13 facing away from the bending portion 1211. In one embodiment, the engagement between the side surface of the middle frame bezel 20 and the side surface of the encapsulating layer 13 is improved through coordination of the protrusion and the recess. In another embodiment, as shown in FIG. 13, the reinforcing member 22 is a recess, and correspondingly a protrusion is provided at the side surface of the encapsulating layer 13 facing away from the bending portion 1211. In one embodiment, the engagement between the side surface of the middle frame bezel 20 and the side surface of the encapsulating layer 13 is similarly improved through coordination of the protrusion and the recess. The present disclosure is not limited thereto, and one embodiment may depend on an actual situation.

One or more reinforcing members may be arranged at the side surface of the middle frame bezel facing the bending portion, which is not limited herein as long as corresponding structure(s) of a same quantity are arranged at the side surface of the encapsulating layer facing away from the bending portion.

In an embodiment, the reinforcing member is formed through curing an adhesive, to have a level of flexibility. Thus, an interaction force between the middle frame bezel and the encapsulating layer is cushioned while the reinforcing member strengthens the engagement between the middle frame bezel and the encapsulating layer.

In an embodiment, the reinforcing member is fabricated through low-injection pressure over-molding (LIPO). In one embodiment, a shape of the reinforcing member can be tuned or better attachment to the side surface of the middle frame bezel facing the bending portion and the side surface of the encapsulating layer facing away from the bending portion. The present disclosure is not limited thereto, and one embodiment may depend on an actual situation.

In an embodiment, the adhesive in the reinforcing member may be epoxy glue, acrylic acid, or polyurethane, which is not limited herein and may depend on an actual situation.

In the forgoing embodiments, the reinforcing member may be located at a part of the periphery of the display module. In an embodiment, the reinforcing member may be located at one side of the display module, or at two adjacent sides of the display module, when viewed along the thickness direction Y. A specific side of the display module is not limited herein as long as assembling the cover plate and the middle frame bezel is not affected.

Figure 14:
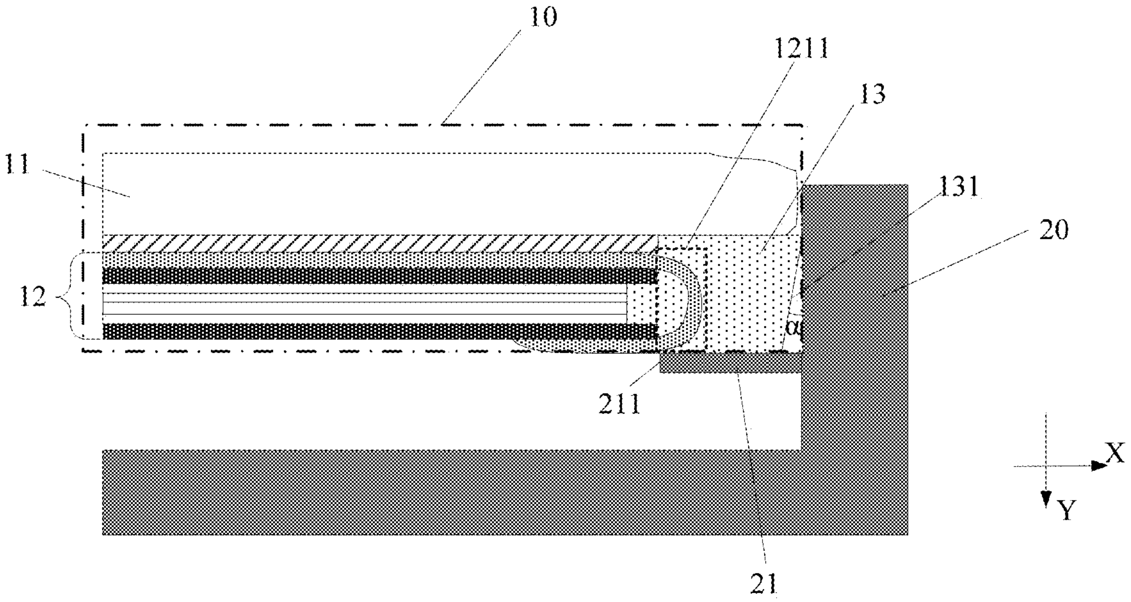
FIG. 14 is a schematic sectional view of a part of a display device according to another embodiment of the present disclosure.

In another embodiment, as shown in FIG. 14, a side surface of the encapsulating layer 13 facing away from the bending portion 1211 includes an inclined surface 131, and there is a first included angle $\alpha$ between the inclined surface 131 and a side surface of the middle frame bezel 20 facing to the bending portion 1211. In one embodiment, a contact point between the inclined surface 131 and the middle frame bezel 20 may serve as an anchor point for assembling the middle frame bezel 20 and the display component, which improves accuracy of the assembling.

Figure 15:
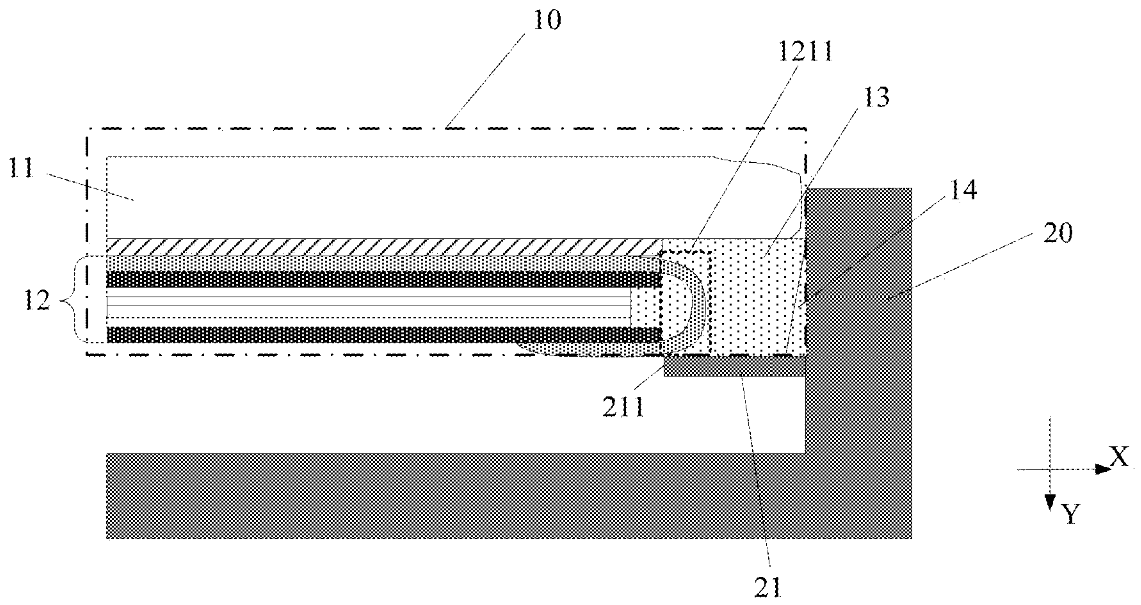
FIG. 15 is a schematic sectional view of a part of a display device according to another embodiment of the present disclosure.

In an embodiment, as shown in FIG. 15, a caulking member 14 is disposed between the middle frame bezel 20 and the inclined surface of the encapsulating layer 13. That is, a gap between the encapsulating layer 13 and the middle frame bezel 20 is filled with the caulking member 14, and the encapsulating layer 13 is less likely to wag. In one embodiment, peeling of the encapsulating layer 13 is less probable.

In an embodiment, the first included angle $\alpha$ between the inclined surface and the side surface of the middle frame bezel facing the bending portion ranges from 5° to 15°. In one embodiment, the first included angle $\alpha$ is neither too small, in which case it is difficult to anchor with the contact point of the inclined surface, nor too large, in which case the encapsulating layer provides little protection on a side surface of the bending portion facing the middle frame bezel. The present disclosure is not limited thereto, and one embodiment may depend on an actual situation.

In practice, a side surface of the encapsulating layer 13 facing away from the middle frame bezel 20 may include another inclined surface, and the other inclined surface has a different inclined angle from the inclined surface at the side surface of the encapsulating layer 13 facing away from the bending portion 1211.

In an embodiment, an included angle between the other inclined surface and a side surface of the middle frame bezel is 15°, which is not limited herein and may depend on an actual situation.

Figure 16:
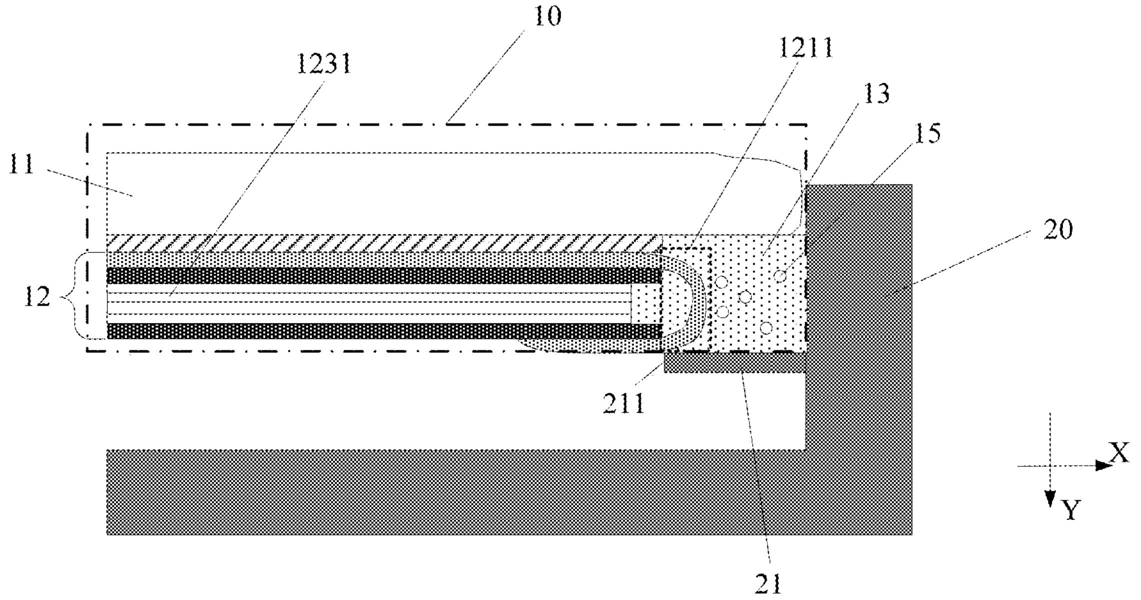
FIG. 16 is a schematic sectional view of a part of a display device according to another embodiment of the present disclosure.
Figure 17:
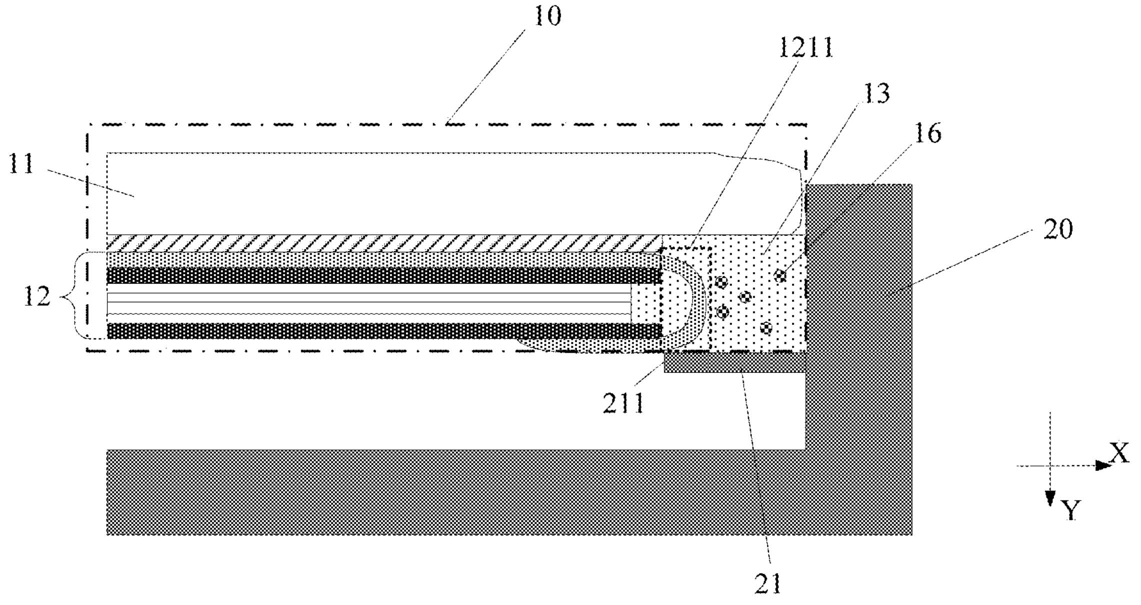
FIG. 17 is a schematic sectional view of a part of a display device according to another embodiment of the present disclosure.
Figure 18:
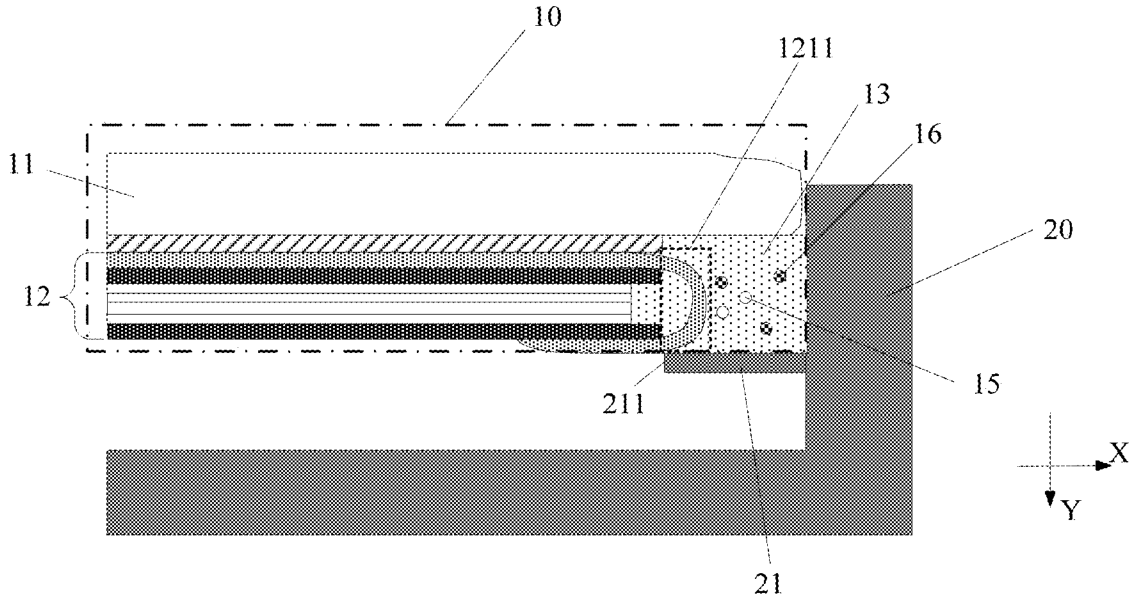
FIG. 18 is a schematic sectional view of a part of a display device according to another embodiment of the present disclosure.

In an embodiment, as shown in FIGS. 16 to 18, one or more holes 15 and/or one or more particles 16 are disposed in the encapsulating layer 13. Thus, the hole(s) 15 and/or particle(s) 16 can reduce an amount of material used in the encapsulating layer 13 when a gap between the middle frame bezel 20 and the bending portion 1211 is fixed. Accordingly, curing the encapsulating layer 13 consumes less time, and a manufacturing cost of the encapsulating layer 13 is reduced.

In an embodiment, as shown in FIG. 16, the encapsulating layer 13 is provided with the one or more holes 15. Thus, the hole(s) 15 reduce an amount of material used in the encapsulating layer 13 when a gap between the middle frame bezel 20 and the bending portion 1211 is fixed. Accordingly, curing the encapsulating layer 13 consumes less time, and a manufacturing cost of the encapsulating layer 13 is reduced. There may be only one hole 15 in the encapsulating layer 13, or there may be multiple holes 15 in the encapsulating layer 13, which is not limited herein and may depend on an actual situation.

In another embodiment, as shown in FIG. 17, the encapsulating layer 13 is provided with the one or more particles 16. Thus, the particle(s) 16 reduce an amount of material used in the encapsulating layer 13 when a gap between the middle frame bezel 20 and the bending portion 1211 is fixed. Accordingly, curing the encapsulating layer 13 consumes less time, and a manufacturing cost of the encapsulating layer 13 is reduced. There may be only one particle 16 in the encapsulating layer 13, or there may be multiple particles 16 in the encapsulating layer 13, which is not limited herein and may depend on an actual situation.

In another embodiment, as shown in FIG. 18, one or more holes 15 and one or more particles 16 are both disposed in the encapsulating layer 13. Thus, the hole(s) 15 and the particle(s) 16 can reduce an amount of material used in the encapsulating layer 13 when a gap between the middle frame bezel 20 and the bending portion 1211 is fixed. Accordingly, curing the encapsulating layer 13 consumes less time, and a manufacturing cost of the encapsulating layer 13 is reduced.

Figure 19:
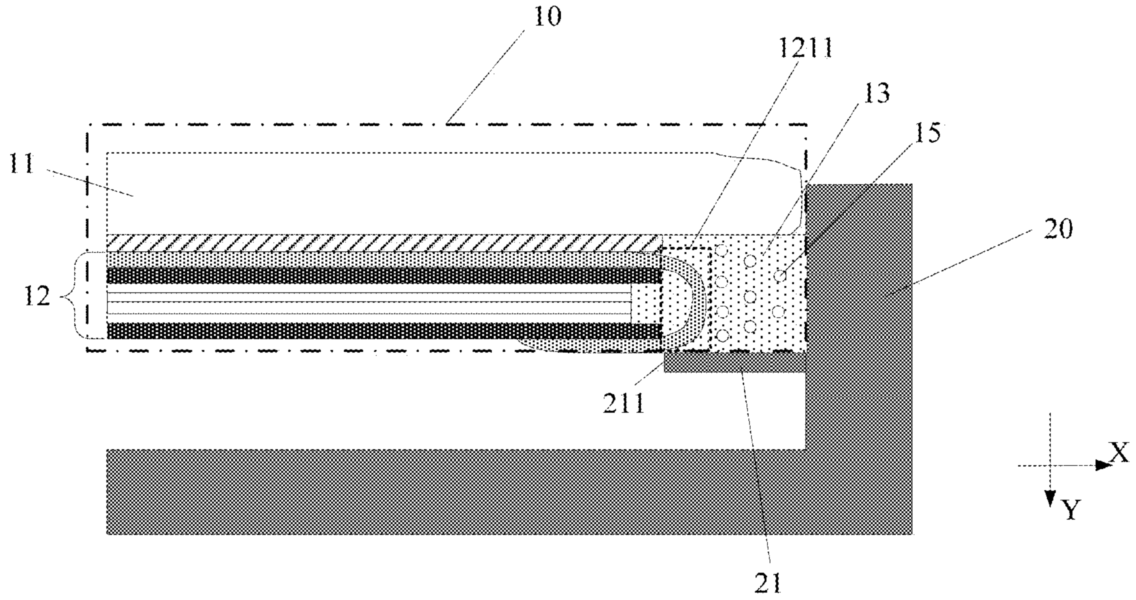
FIG. 19 is a schematic sectional view of a part of a display device according to another embodiment of the present disclosure.
Figure 20:
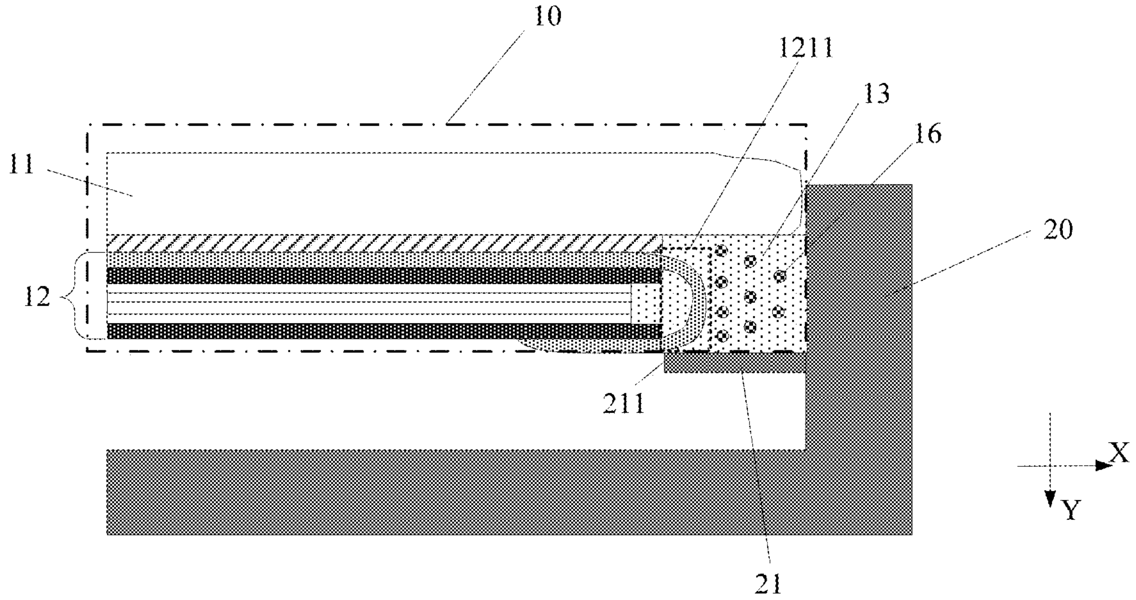
FIG. 20 is a partial sectional view of a display device according to another embodiment of the present disclosure.

In an embodiment, as shown in FIG. 19, multiple holes 15 are disposed in the encapsulating layer 13, and a density of the holes 15 in the encapsulating layer 13 decreases gradually along a direction pointing from the bending portion 1211 towards the middle frame bezel 20. In one embodiment, engagement between the middle frame bezel 20 and the encapsulating layer 13 is ensured while reducing an amount of material used in the encapsulating layer 13. Similarly, in an embodiment as shown in FIG. 20, multiple particles 16 are disposed in the encapsulating layer 13, and a density of the particles 16 in the encapsulating layer 13 decreases gradually along a direction pointing from the bending portion 1211 towards the middle frame bezel 20. In one embodiment, engagement between the middle frame bezel 20 and the encapsulating layer 13 is ensured while reducing an amount of material used in the encapsulating layer 13.

Figure 21:
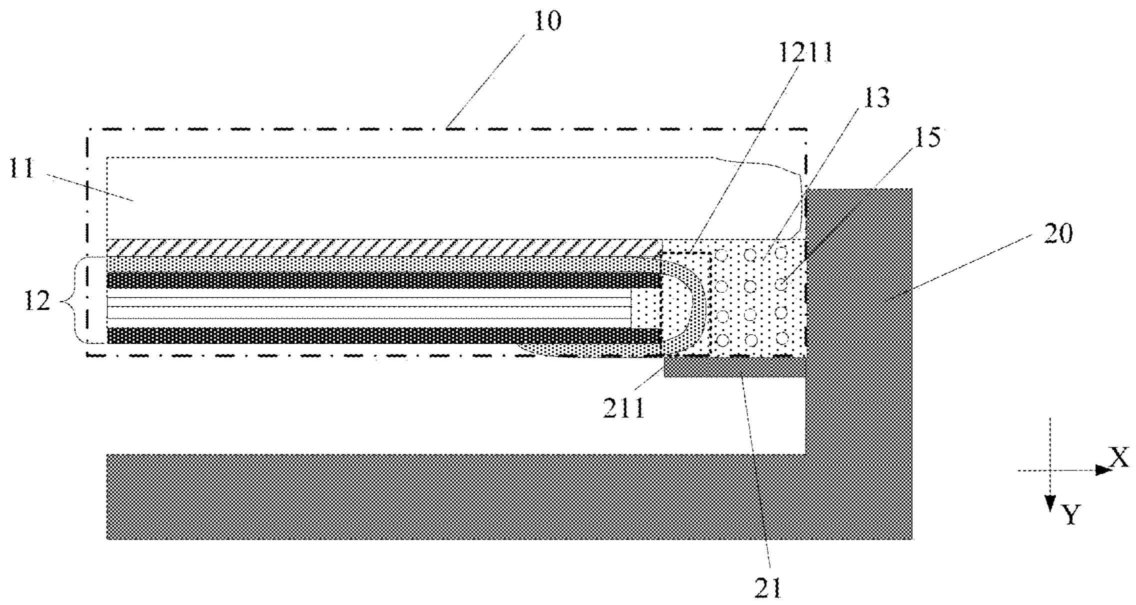
FIG. 21 is a schematic sectional view of a part of a display device according to another embodiment of the present disclosure.
Figure 22:
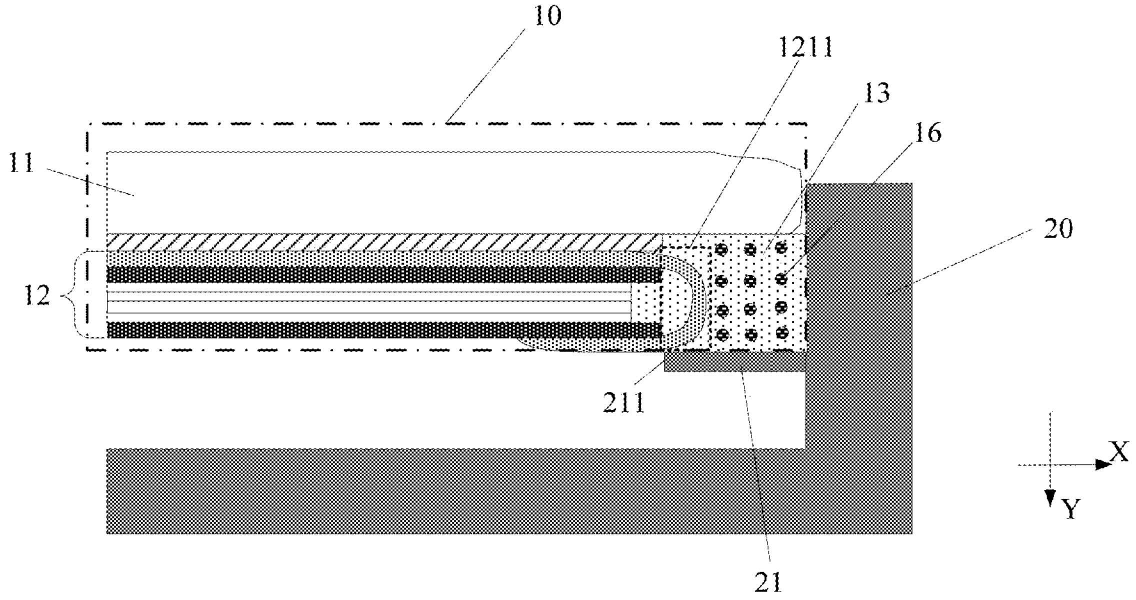
FIG. 22 is a schematic sectional view of a part of a display device according to another embodiment of the present disclosure.

In another embodiment, as shown in FIG. 21, multiple holes 15 are disposed in the encapsulating layer 13, and a density of the holes 15 in the encapsulating layer 13 is uniform along a direction pointing from the bending portion 1211 towards the middle frame bezel 20. In one embodiment, the holes 15 distribute uniformly in the encapsulating layer 13, and a performance of the encapsulating layer 13 is more uniform while reducing an amount of material used in the encapsulating layer 13. Similarly, in an embodiment as shown in FIG. 22, multiple particles 16 are disposed in the encapsulating layer 13, and a density of the particles 16 in the encapsulating layer 13 is uniform along a direction pointing from the bending portion 1211 towards the middle frame bezel 20. In one embodiment, the particles 16 distribute uniformly in the encapsulating layer 13, and a performance of the encapsulating layer 13 is more uniform while reducing an amount of material used in the encapsulating layer 13. The present disclosure is not limited thereto, and one embodiment may depend on an actual situation.

Figure 23:
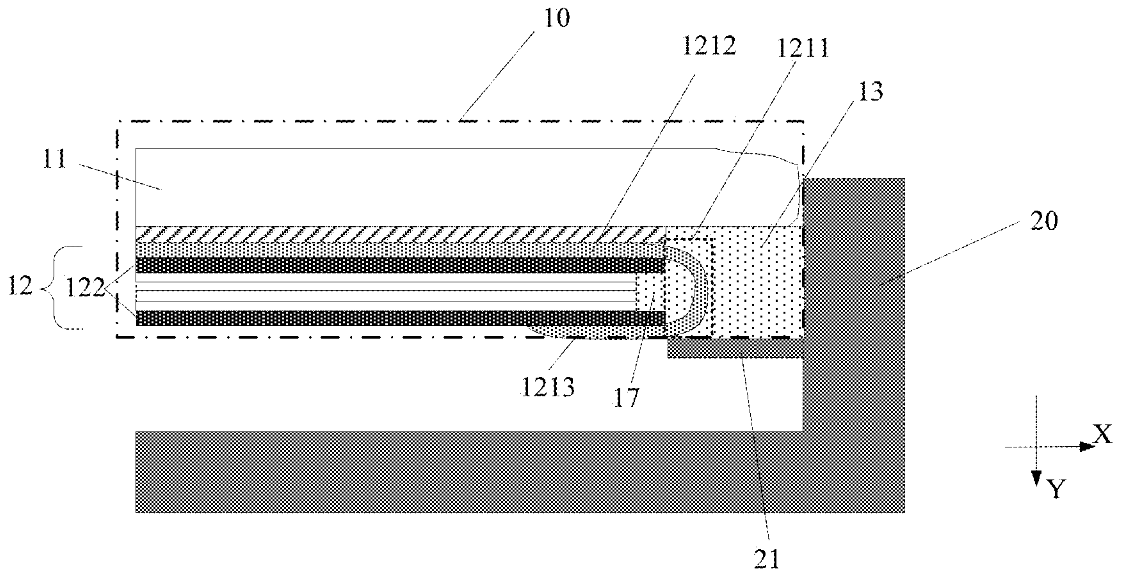
FIG. 23 is a schematic sectional view of a part of a display device according to another embodiment of the present disclosure.

In an embodiment, as shown in FIG. 23, the display panel 121 further includes a first panel portion 1212 and a second panel portion 1213. The bending portion 1211 extends along a curving direction, and two terminals of the bending portion 1211 along the curving direction are connected to the first panel portion 1212 and the second panel portion 1213, respectively. The first panel portion 1212 is closer to the cover plate 11 than the second panel portion 1213. In an embodiment, the first panel portion 1212, the bending portion 1211, and the second panel portion 1213 are an integral component. Along the thickness direction Y, the supporting layer 122 is located between the first panel portion 1212 and the second panel portion 1213.

Figure 24:
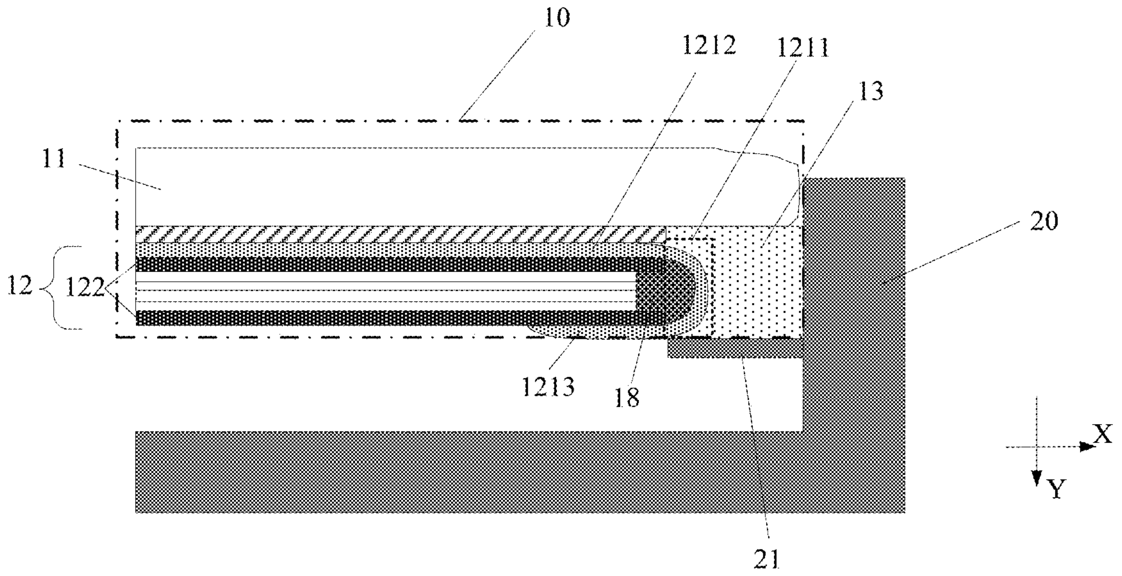
FIG. 24 is a schematic sectional view of a part of a display device according to another embodiment of the present disclosure.

In an embodiment, as shown in FIGS. 23 and 24, a padding 17 and/or an inner support 18 are disposed at a concave side of the bending portion 1211. The padding 17 and the encapsulating layer 13 are made of a same material. Thus, in a case that the padding 17 is disposed at the concave side of the bending portion 1211, the padding 17 and the encapsulating layer 13 may be fabricated by using the same material, which simplifies manufacturing of the display device. The inner support 18 and the encapsulating layer 13 are made of different materials. Thus, in a case that the inner support 18 is disposed at the concave side of the bending portion 1211, the inner support 18 and the encapsulating layer 13 may be made of corresponding materials based on different functional requirements.

In an embodiment, as shown in FIGS. 23 and 24, the padding 17 or the inner support 18 is disposed at the concave side of the bending portion 1211, a side surface of the padding 17 or the inner support 18 facing the middle frame bezel 20 is attached to the bending portion 1211, and another side surface of the padding 17 or the inner support 18 facing away from the middle frame bezel 20 is attached to the supporting layer 122. Thus, a gap between the bending portion 1211 and the supporting layer 122 is completely filled with the padding 17 or the inner support 18. A position of the concave surface of the bending portion 1211 is fixed, and hence the bending portion 1211 is less likely to wag.

Figure 25:
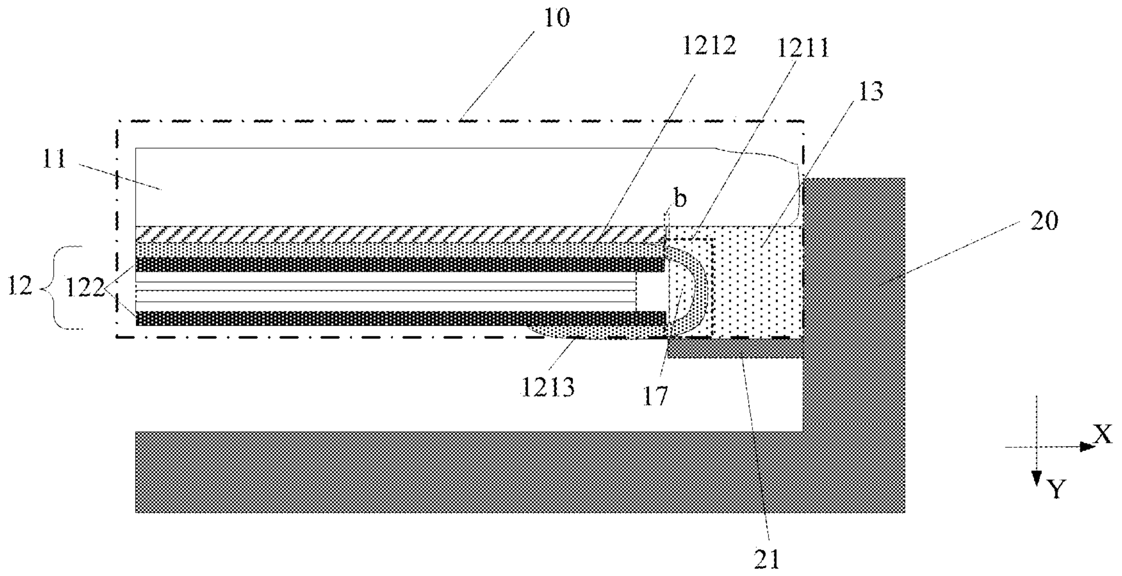
FIG. 25 is a schematic sectional view of a part of a display device according to another embodiment of the present disclosure.
Figure 26:
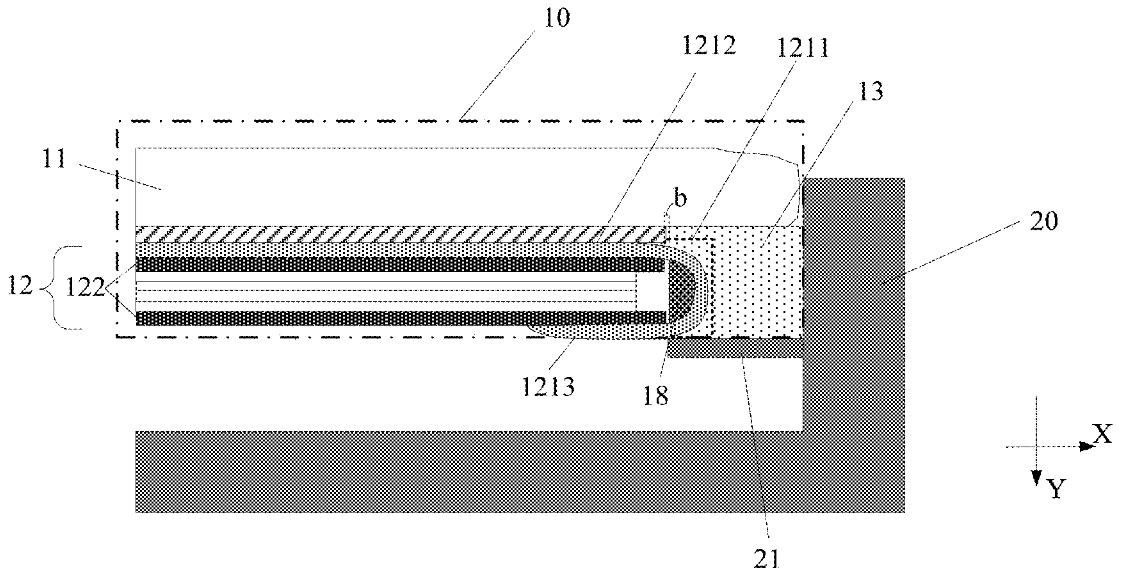
FIG. 26 is a schematic sectional view of a part of a display device according to another embodiment of the present disclosure.

In another embodiment, as shown in FIGS. 25 and 26, the padding 17 or the inner support 18 is disposed at the concave side of the bending portion 1211, a side surface of the padding 17 or the inner support 18 facing the middle frame bezel 20 is attached to the bending portion 1211, and another side surface of the padding 17 or the inner support 18 facing away from the middle frame bezel 20 is spaced from the supporting layer 122 by a second distance b which is greater than zero. In one embodiment, the padding 17 or the inner support 18 is not in contact with the supporting layer 122. The padding 17 or the inner support 18 is prevented from intruding an interior of the composite layer due to a capillary effect during manufacturing, and hence the composite layer is protected against a risk of being polluted inside and/or easy to peel off.

Figure 27:
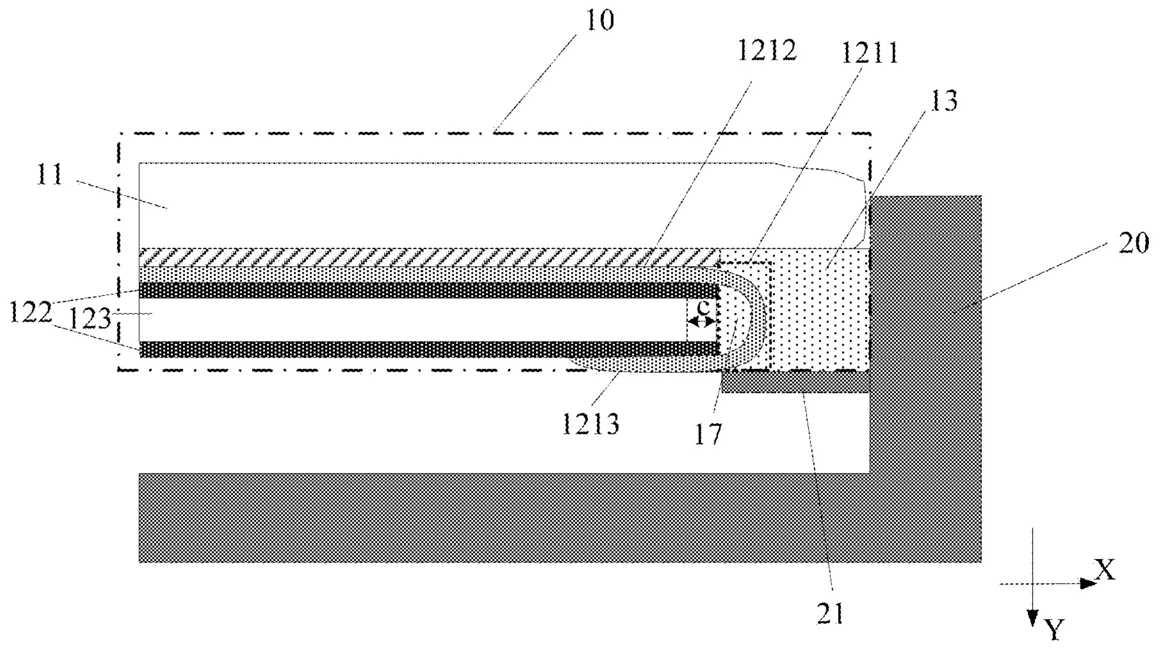
FIG. 27 is a schematic sectional view of a part of a display device according to another embodiment of the present disclosure.
Figure 28:
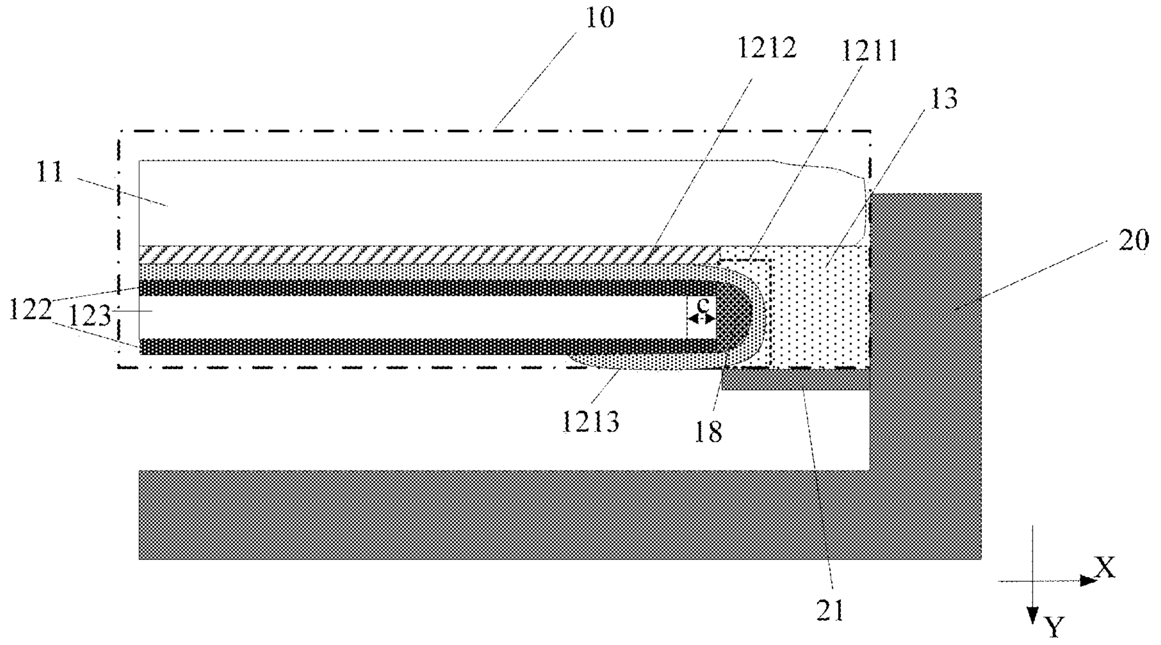
FIG. 28 is a schematic sectional view of a part of a display device according to another embodiment of the present disclosure.

In an embodiment, as shown in FIGS. 27 and 28, a length of the composite layer 123 is smaller than a length of the supporting layer 122 along the first direction X. That is, along the first direction X, a distance between an end of the composite layer 123 close to the bending portion 1211 and the arc top of the bending portion 1211 is greater than a distance between an end of the supporting layer 122 close to the bending portion 1211 and the arc top of the bending portion 1211. Herein when the padding 17 or the inner support 18 is disposed at the concave side of the bending portion 1211, a side surface of the padding 17 or the inner support 18 facing the middle frame bezel 20 is attached to the bending portion 1211, and another of the padding 17 or the inner support 18 facing away from the middle frame bezel 20 is attached to the supporting layer 122 while spaced apart from the composite layer 123 by a first sub-distance c. That is, the padding 17 or the inner support 18 is not in contact with the composite layer 123. In one embodiment, the position of the concave surface of the bending portion 1211 is fixed by the padding 17 or the inner support 18, and the bending portion 1211 is less likely to wag. On such basis, the padding 17 or the inner support 18 is prevented from intruding an interior of the composite layer due to a capillary effect during manufacturing, and hence the composite layer is protected against a risk of being polluted inside and/or easy to peel off.

Figure 29:
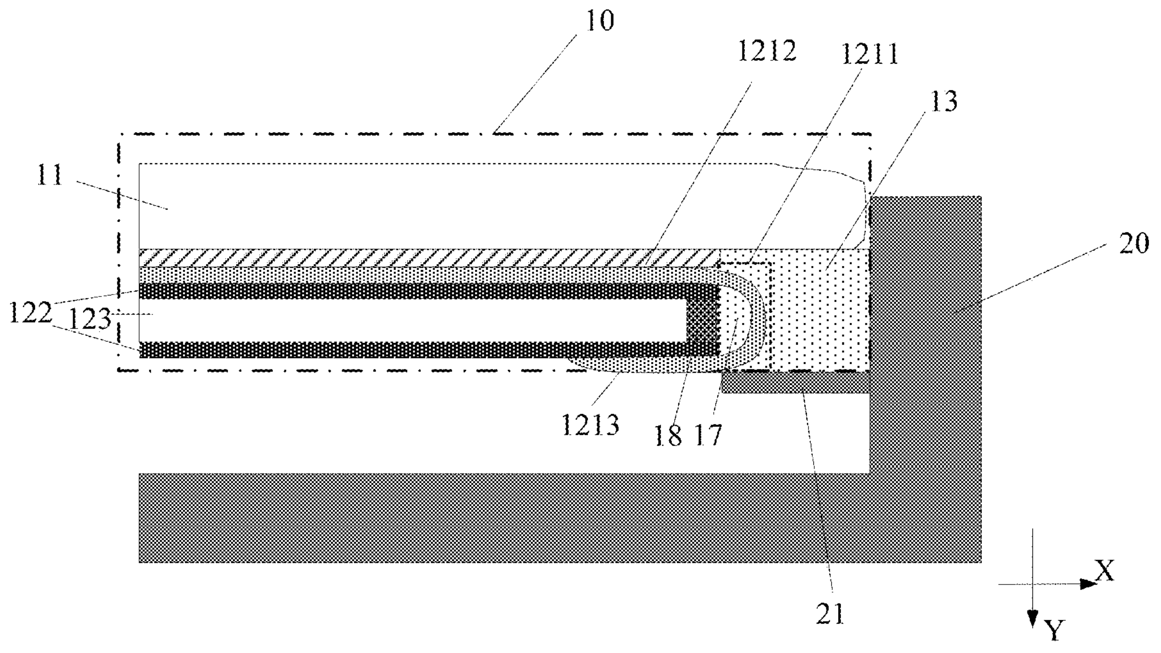
FIG. 29 is a schematic sectional view of a part of a display device according to another embodiment of the present disclosure.
Figure 30:
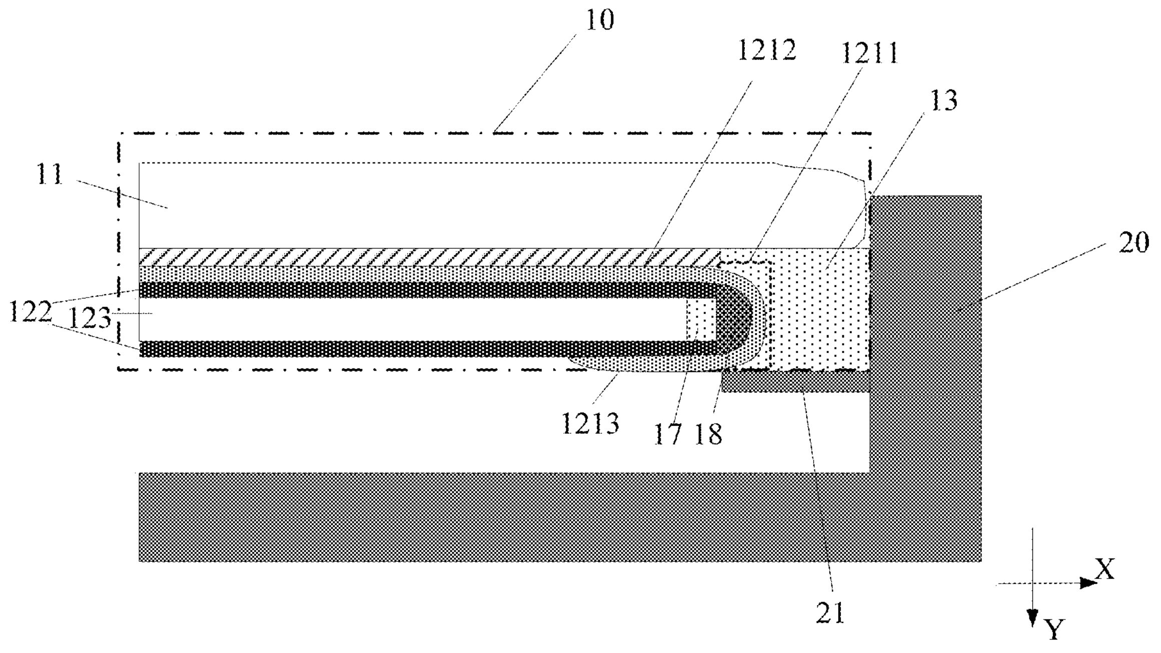
FIG. 30 is a schematic sectional view of a part of a display device according to another embodiment of the present disclosure.

In an embodiment, as shown in FIG. 29, both the padding 17 and the inner support 18 are arranged at the concave side of the bending portion 1211, and the inner support 18 is disposed at a side of the padding 17 facing the supporting layer 122. In one embodiment, different materials may be selected in the display device based on a functional requirement on different positions along the first direction X in a space between the bending portion 1211 and the supporting layer 122. In an embodiment, hardness of the inner support 18 is greater than that of the padding 17 after solidification (e.g., curing). In one embodiment, the padding 17 is further prevented from intruding the interior of the composite layer 123 due to the capillary effect during manufacturing, and hence the composite layer 123 is further protected against the risk of being polluted inside and/or easy to peel off. In another embodiment, as shown in FIG. 30, the inner support 18 is disposed at a side of the padding 17 away from the supporting layer 122. In such embodiment, hardness of the inner support 18 may be smaller than that of the padding 17 after solidification (e.g., curing). In one embodiment, the inner support 18 is further prevented from intruding the interior of the composite layer 123 due to the capillary effect during manufacturing, and hence the composite layer 123 is further protected against the risk of being polluted inside and/or easy to peel off.

In an embodiment, as shown in FIG. 29, the length of the supporting layer 122 is greater than the length of the composite layer 123 along the first direction X, and a boundary between the padding 17 and the inner support 18 and a terminal of the supporting layer 122 close to the bending portion 1211 is aligned with a same position along the first direction X. In one embodiment, a position of a boundary between the padding 17 and the inner support 18 is easy to control when fabricating the padding 17 and the inner support 18. The present disclosure is not limited thereto, and one embodiment may depend on an actual situation.

Figure 31:
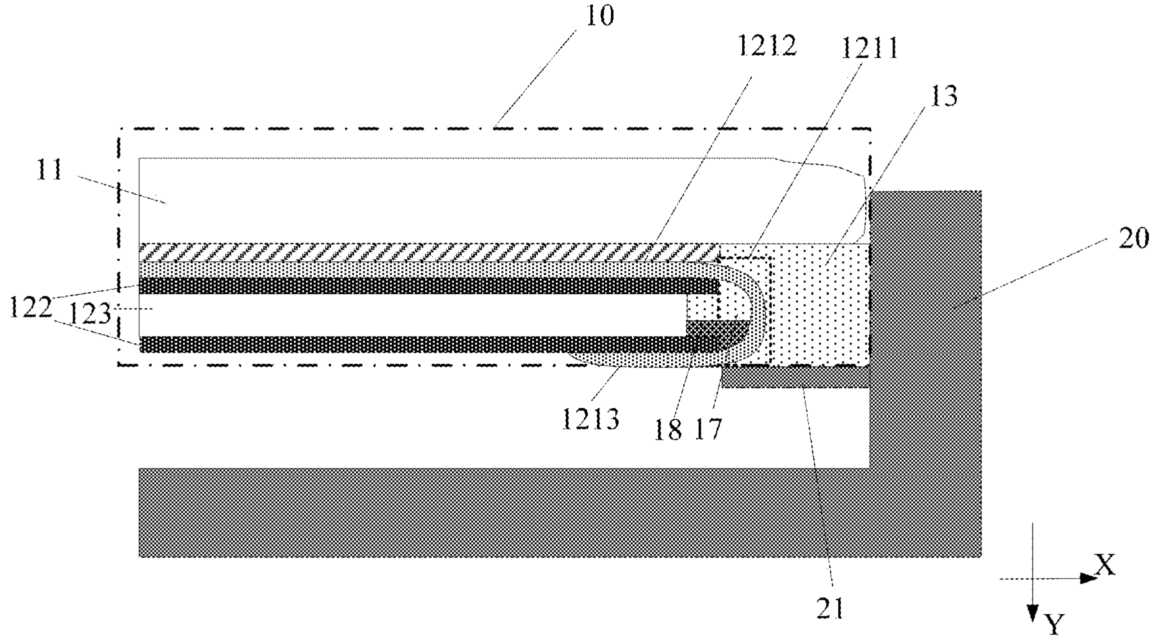
FIG. 31 is a schematic sectional view of a part of a display device according to another embodiment of the present disclosure.
Figure 32:
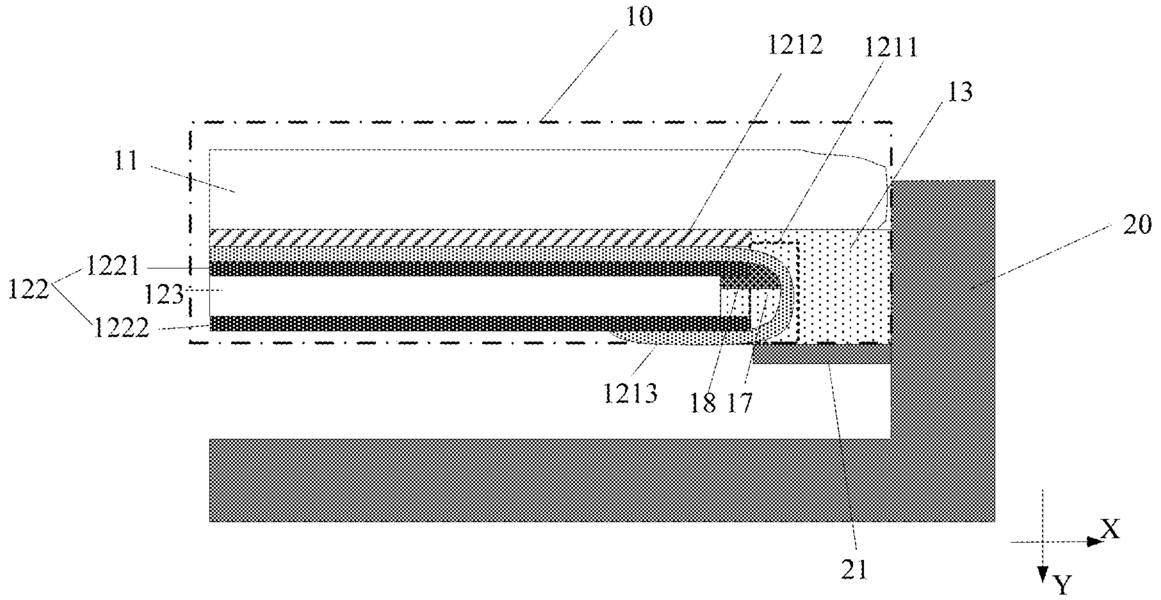
FIG. 32 is a schematic sectional view of a part of a display device according to another embodiment of the present disclosure.

In another embodiment, as shown in FIG. 31, the padding 17 and the inner support 18 are disposed at the concave side of the bending portion 1211, and the padding 17 is disposed at a side of the inner support 18 facing the cover plate 11. In one embodiment, as shown in FIG. 32, the inner support 18 is disposed at a side of the padding 17 facing the cover plate 11. In one embodiment, different materials may be selected in the display device based on a functional requirement on different positions along the thickness direction Y in the space between the bending portion 1211 and the supporting layer 122. The present disclosure is not limited thereto, and one embodiment may depend on an actual situation.

In an embodiment, a maximum length of the padding 17 is equal to a maximum length of the inner support 18 along the thickness direction Y. That is, along the thickness direction Y, the padding 17 occupies a half of the space defined by the bending portion 1211, the supporting layer 122, and the composite layer 123, and the inner support 18 occupies the other half of the such space. That is, the padding 17 and the inner support 18 are evenly distributed in the such space. The present disclosure is not limited thereto, and one embodiment may depend on an actual situation.

In an embodiment, as shown in FIG. 32, the supporting layer 122 includes a first supporting layer 1221 and a second supporting layer 1222. The first supporting layer 1221 is disposed at a side of the first panel portion 1212 away from the cover plate 11, and hence is capable to maintain a shape of the first panel portion 1212 in a case that the display panel 121 is flexible. The second supporting layer 1222 is disposed at a side of the second panel portion 1213 facing the cover plate 11, and hence is capable to maintain a shape of the second panel portion 1213 in a case that the display panel 121 is flexible. Herein a terminal of the first supporting layer 1221 close to the bending portion 1211 may be called a first terminal, and a terminal of the second supporting layer 1222 close to the bending portion 1211 may be called a second terminal. The first end and the second end may be aligned with each other when viewed along the thickness direction Y, which facilitates manufacturing of the supporting layer 122 and the composite layer 123.

Figure 33:
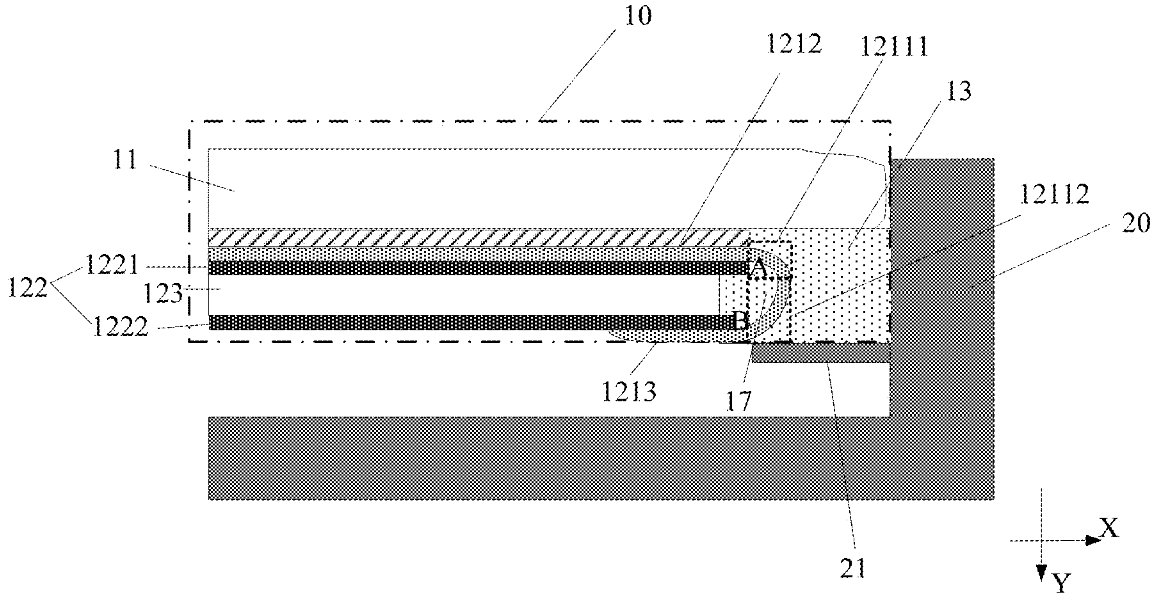
FIG. 33 is a schematic sectional view of a part of a display device according to another embodiment of the present disclosure.

In another embodiment, as shown in FIG. 33, the terminal of the first supporting layer 1221 close to the bending portion 1211 is denoted as the first terminal A, and the terminal of the second supporting layer 1222 close to the bending portion 1211 is denoted as the second end B. The first end A and the second end B are not aligned with each other when viewed along the thickness direction Y. In one embodiment, an area of the border region of the display device may be reduced through adjusting a relative position of the first end A and the second end B.

In an embodiment, as shown in FIG. 33, the bending portion 1211 has the arc top, and the first end A of the first supporting layer 1221 is closer to the arc top than the second end B of the second supporting layer 1222. In practice, a distance between the cover plate to a terminal of the bending portion 1211 away from the cover plate 11 along the thickness direction Y may be fixed. In such case, the first end A of the first supporting layer 1221 being closer to the arc top than the second end B of the second supporting layer 1222 enables the second supporting layer 1222, the composite layer 123, and the like as a whole to move towards a direction pointing from the supporting layer 122 away from the bending portion 1211. In one embodiment, a maximum distance of the bending portion 1211 extending out of the supporting layer 122 along the first direction X is reduced, and thus a length of the cover plate 11 along the first direction X can be reduced. The border region of the display device can shrink under a fixed display area.

In an embodiment, as shown in FIG. 33, the bending portion 1211 include a first bending section 12111 and a second bending section 12112. The first bending section 12111 is connected to the first panel portion 1212, the second bending section 12112 is connected to the second panel portion 1213, and a radius of curvature of the first bending section 12111 is different from a radius of curvature of the second bending section 12112. In one embodiment, the area of the border region of the display device can be reduced through configuring the radii of curvature of the first bending section 12111 and the second bending section 12112.

In an embodiment, as shown in FIG. 33, the radius of curvature of the first bending section 12111 is smaller than the radius of curvature of the second bending section 12112. In such case, the second supporting layer 1222, the composite layer 123, and the like as a whole are moved towards the direction pointing from the supporting layer 122 away from the bending portion 1211 through decreasing the radius of curvature of the first bending section 12111, when the display area of the display device is fixed. In one embodiment, a maximum distance of the bending portion 1211 extending out of the supporting layer 122 along the first direction X is reduced, and thus a length of the cover plate 11 along the first direction X can be reduced. The border region of the display device can shrink under the fixed display area.

In an embodiment, the radius of curvature of the second bending section 12112 ranges from 0.15 mm to 0.3 mm. In one embodiment, the radius of curvature of the second bending section is neither too small, in which case the second bending section is creased and a signal line in the second bending section breaks, nor too large, in which case the border region of the display device is large.

In an embodiment, the radius of curvature of the first bending section 12111 ranges from 0.05 mm to 0.2 mm. In one embodiment, the radius of curvature of the first bending section is neither too small, in which case the first bending section is creased and a signal line in the second bending section breaks, nor too large, in which case the border region of the display device is large, while ensuring that the radius of curvature of the first bending section is smaller than the radius of curvature of the second bending section.

Figure 34:
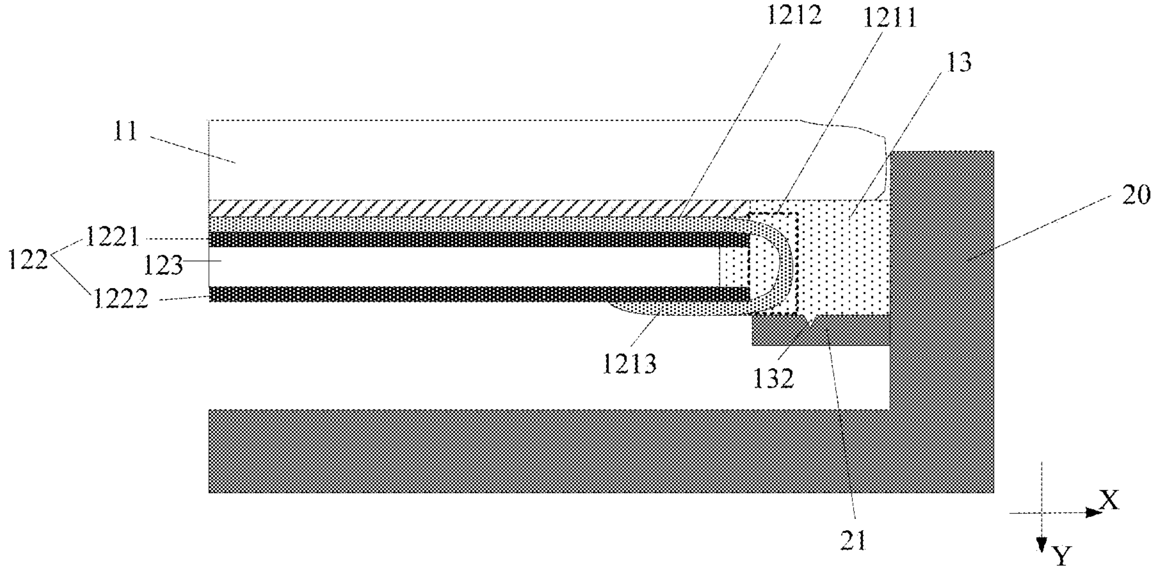
FIG. 34 is a schematic sectional view of a part of a display device according to another embodiment of the present disclosure.

In an embodiment, as shown in FIG. 34, a first protrusion 132 is disposed at a surface of the encapsulating layer 13 facing away from the cover plate 11, a first recess is provided at a surface of the supporting platform 21 facing the cover plate 11, and at least a part of the first protrusion 132 snaps into the first recess. In one embodiment, fixed connection between the encapsulating layer 13 and the supporting platform 21 is strengthened through coordination of the first protrusion 132 and the first recess.

In an embodiment, as shown in FIG. 34, a width of the first protrusion 132 decreases gradually along a direction pointing from the cover plate 11 to the encapsulating layer 13 in a cross section of the display device. In an embodiment, along the first direction X, the first protrusion 132 has a first surface and a second surface between which a distance decreases gradually along the direction pointing from the cover plate 11 to the encapsulating layer 13. Hence, it is convenient to insert the first protrusion 132 at least partially into the first recess.

Figure 35:
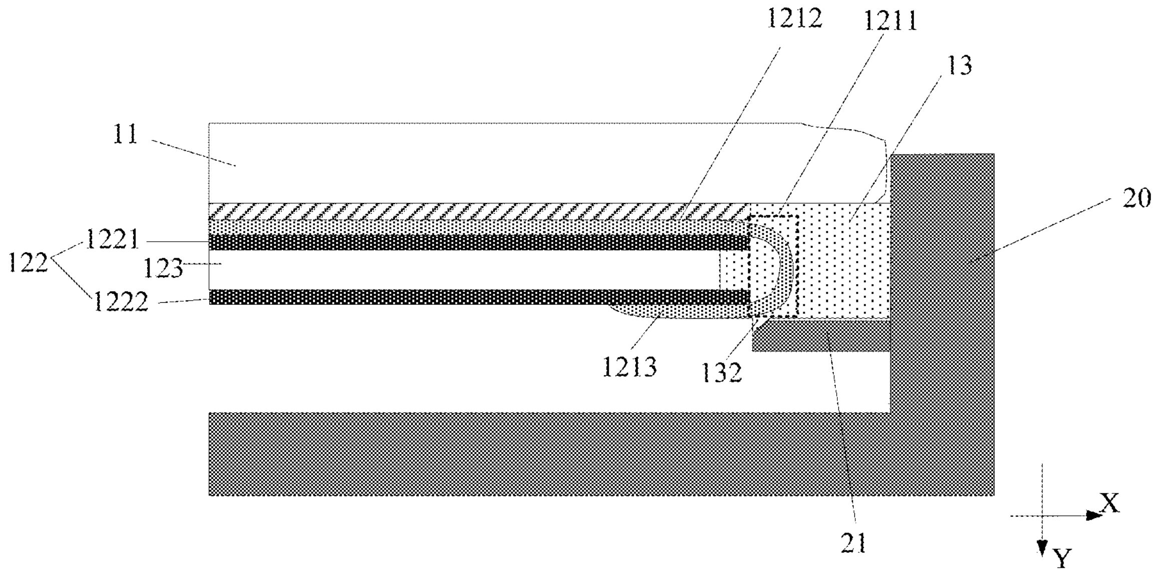
FIG. 35 is a schematic sectional view of a part of a display device according to another embodiment of the present disclosure.
Figure 36:
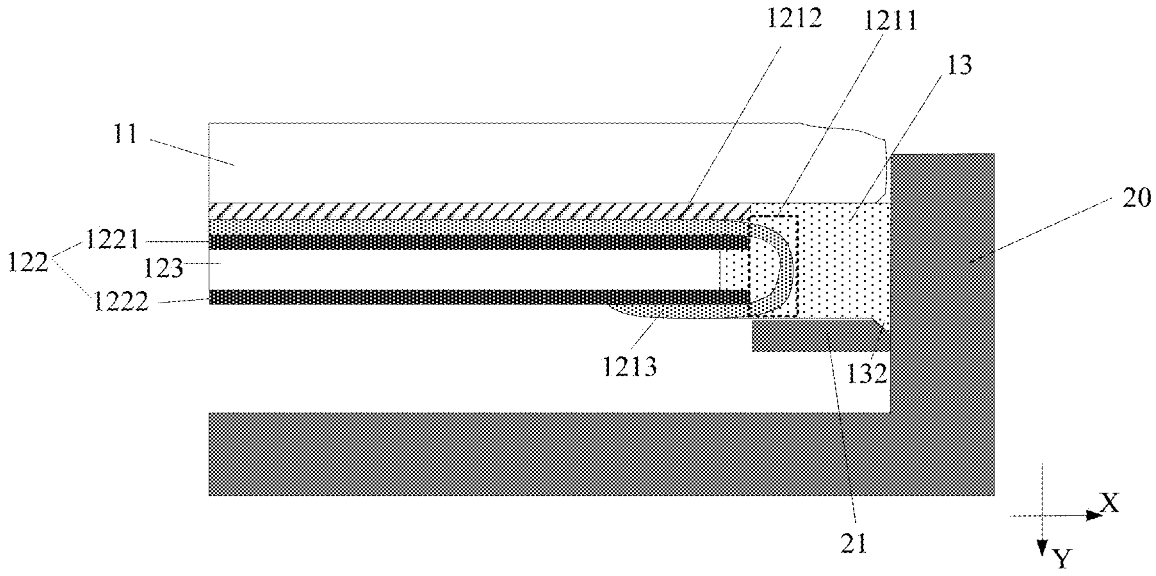
FIG. 36 is a schematic sectional view of a part of a display device according to another embodiment of the present disclosure.

In an embodiment, as shown in FIG. 34, an included angle between the first surface of the first protrusion 132 and the reference plane at the bottom of the first protrusion 132 is an acute angle, and an included angle between the second surface of the first protrusion 132 and the reference plane at the bottom of the first protrusion 132 is also an acute angle. In another embodiment, as shown in FIG. 35, the first surface of the first protrusion 132 is perpendicular to the reference plane, and an included angle between the second surface of the first protrusion 132 and the reference plane at the bottom of the first protrusion 132 is an acute angle. In another embodiment, as shown in FIG. 36, an included angle between the first surface of the first protrusion 132 and the reference plane at the bottom of the first protrusion 132 is an acute angle, and the second surface of the first protrusion 132 is perpendicular to the reference plane. The present disclosure is not limited thereto, and one embodiment may depend on an actual situation.

In the above embodiments, as shown in FIG. 35, in a case that the first surface of the first protrusion 132 is perpendicular to the reference plane, the first surface of the first protrusion 132 may be located in a same vertical plane as a side surface of the supporting platform 21 facing away from the middle frame bezel 20. The present disclosure is not limited thereto, and one embodiment may depend on an actual situation.

Figure 37:
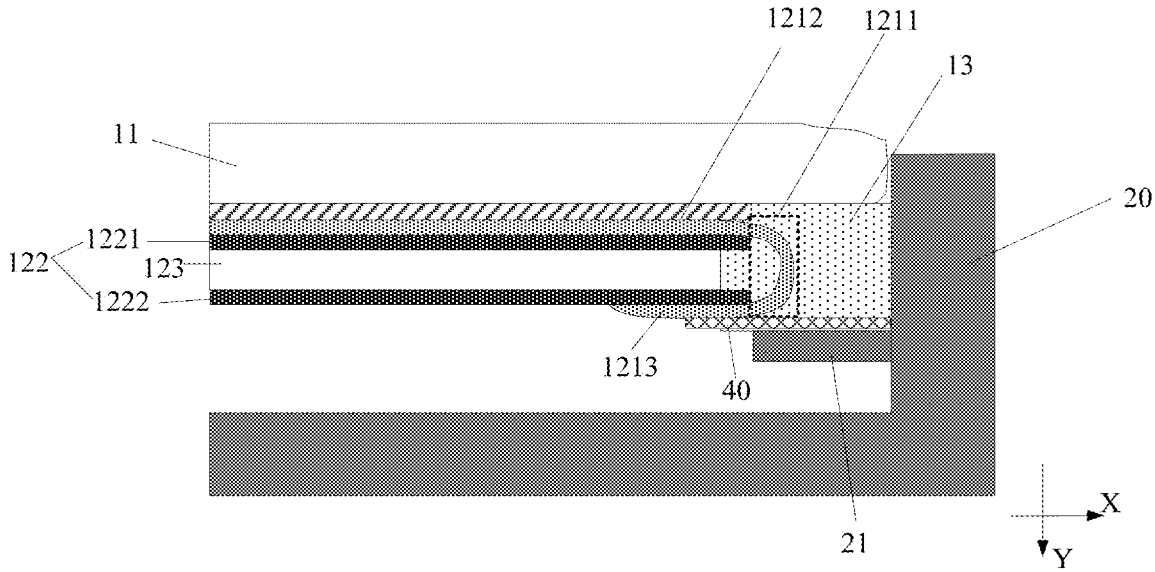
FIG. 37 is a schematic sectional view of a part of a display device according to another embodiment of the present disclosure.

In an embodiment, as shown in FIG. 37, the display device further includes a connecting plate 40, which is disposed at a side of the second panel portion 1213 away from the cover plate 11. The connecting plate 40 is configured to support the display component at a side surface of the second panel portion 1213 facing away from the cover plate 11 along the thickness direction Y. In an embodiment, a portion of the connecting plate 40 is inserted into the encapsulating layer 13. In one embodiment, a fixed connection between the connecting plate 40 and the encapsulating layer 13 is strengthened, and a pressure on the supporting platform 21 is reduced due to the vertical support of the connecting plate 40 for the encapsulating layer 13.

In an embodiment, the connecting plate 40 includes a sheet metal piece. In one embodiment, a support capability of the connecting plate is improved. The present disclosure is not limited thereto, and one embodiment may depend on an actual situation.

In an embodiment, the display device further includes an adhesive disposed between the connecting plate 40 and the second panel portion 1213. In one embodiment, the connecting plate is fixedly connected to the second panel portion. The present disclosure is not limited thereto, and one embodiment may depend on an actual situation.

Figure 38:
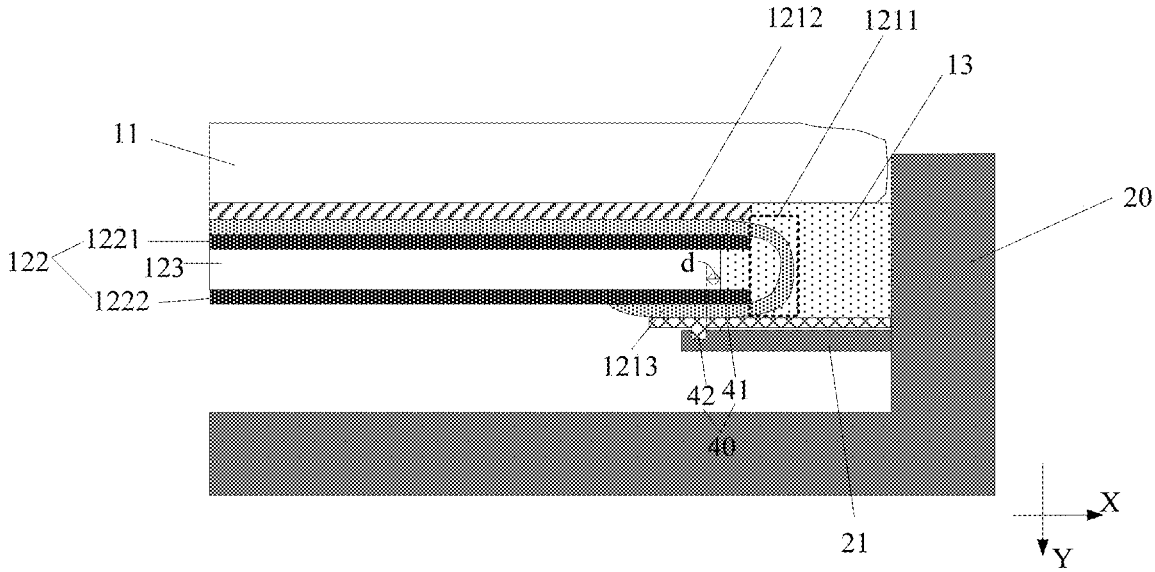
FIG. 38 is a schematic sectional view of a part of a display device according to another embodiment of the present disclosure.

In an embodiment, as shown in FIG. 38, the connecting plate 40 includes a main body 41 and at least one second protrusion 42 disposed on a surface of the main body 41. In an embodiment, the second protrusion 42 protrudes in a direction away from the cover plate 11, and snaps into the supporting platform 21. In one embodiment, a fixed connection between the connecting plate 40 and the supporting platform 21 is strengthened via the second protrusion 42.

Herein the second protrusion 42 protruding in the direction away from the cover plate 11 and snapping into in the supporting platform 21 is capable to strengthen the fixed connection between the connecting plate 40 and the supporting platform 21. Meanwhile, the connecting piece 40 located between the second protrusion 42 and the supporting platform 21 strengthen a fixed connection between the second protrusion 42 and the supporting platform 21. In an embodiment, the second protrusion 42 is attached to the supporting platform 21 via an adhesive layer. In one embodiment, the adhesive layer between the second protrusion 42 and the supporting platform 21 can strengthen the fixed connection between the second protrusion 42 and the supporting platform 21. The present disclosure is not limited thereto, and one embodiment may depend on an actual situation.

Figure 39:
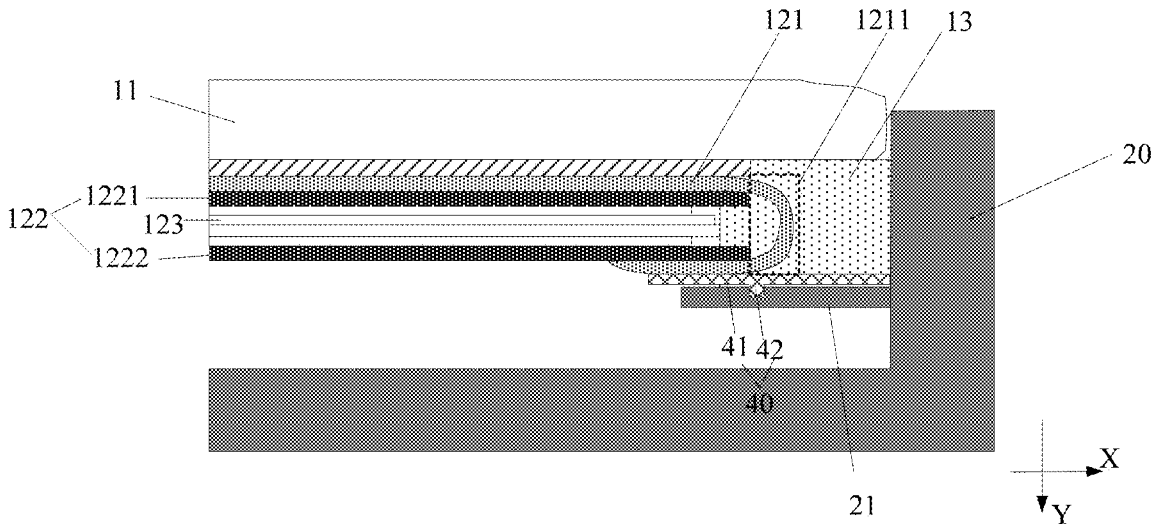
FIG. 39 is a schematic sectional view of a part of a display device according to another embodiment of the present disclosure.

In an embodiment, as shown in FIG. 39, the second protrusion 42 overlaps at least partially with the encapsulating layer 13 when viewed along the thickness direction Y, and at least a part of the second protrusion 42 snaps into the encapsulating layer 13. In one embodiment, the second protrusion 42 is capable to strengthen not only the fixed connection between the connecting plate 40 and the encapsulating layer 13 but also the fixed connection between the connecting plate 40 and the supporting platform 21.

In an embodiment, as shown in FIG. 39, the second protrusion runs through the encapsulating layer 13 located between the main body 41 and the supporting platform 21, and snaps into the supporting platform 21. In one embodiment, not only a part of the second protrusion 42 is located within the encapsulating layer 13, but also another part of the second protrusion dips into the supporting platform 21. The present disclosure is not limited thereto. In another embodiment, the supporting platform 21 may adopt another structure to implement the part within the encapsulating layer and the other part dipping into the supporting platform. One embodiment may depend on an actual situation.

In another embodiment, as shown in FIG. 38, the second protrusion 42 does not overlap with the encapsulating layer 13 when viewed along the thickness direction Y, and hence the second protrusion 42 overlaps with the display module when viewed along the thickness direction Y. In one embodiment, a support of the connecting plate for the display module is strengthened. The present disclosure is not limited thereto, and one embodiment may depend on an actual situation.

In an embodiment, the second protrusion and the encapsulating layer are spaced apart along the first direction by a third distance, of which a length ranges from 0.1 mm to 0.5 mm. In one embodiment, the area of the border region of the display device is reduced, which facilitates achieving the narrow border.

Figure 40:
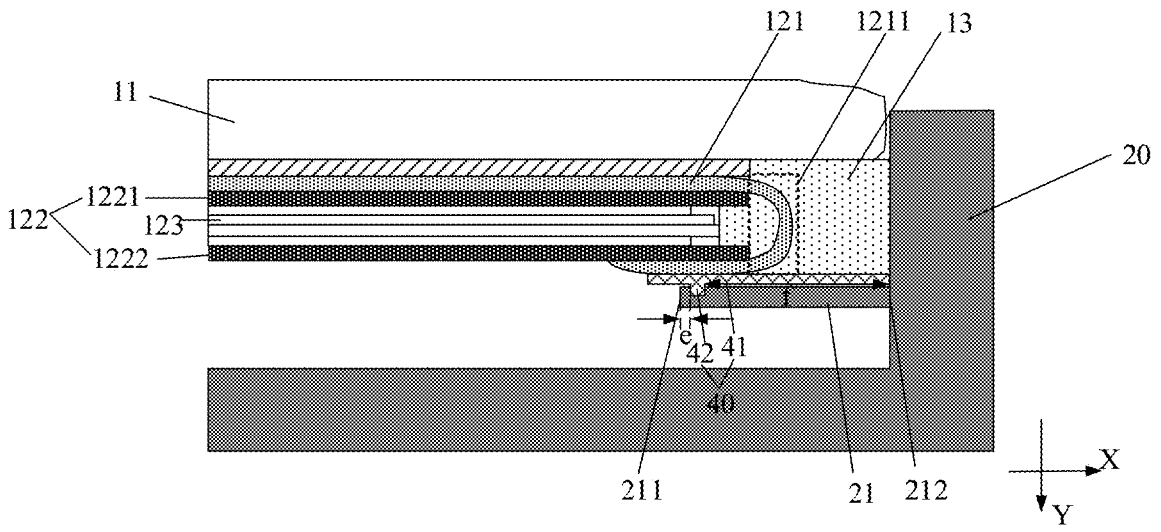
FIG. 40 is a schematic sectional view of a part of a display device according to another embodiment of the present disclosure.

In an embodiment, as shown in FIG. 40, the second protrusion 42 overlaps at least partially with at least two functional layers in the composite layer 123. In one embodiment, the second protrusion 42 can support the composite layer 123, the supporting layer 122, and the display panel 121, which strengthen a support of the connecting plate 40 for the display module. The present disclosure is not limited thereto. In another embodiment, the second protrusion 42 may overlap at least partially with only one functional layer in the composite layer 123, or may not overlap with the composite layer 123. One embodiment may depend on an actual situation.

In an embodiment, as shown in FIG. 40, the supporting platform 21 has with a first terminal 212 and a second terminal 211. The first end 212 of the supporting platform 21 is close to the middle frame bezel 20, and the second end 211 of the supporting platform 21 is away from the middle frame bezel 20. A distance f between the second protrusion 42 and the first end 212 of the supporting platform 21 is greater than a distance e between the second protrusion 42 and the second end 211 of the supporting platform 21. In one embodiment, the second protrusion 42 is located in a portion of the main body 41 close to the composite layer 123, which improves the robustness of the connecting plate via a connecting point between the main body 41 and the middle frame bezel 20 as well as the second protrusion 42. In one embodiment, the display panel 121 is less likely to down-warp when being pressed.

In an embodiment, a ratio of the distance f to the distance e ranges from 5 to 8. That is, the second protrusion is close to the composite layer 123. The robustness of the connecting plate is improved via the connecting point between the main body 41 and the middle frame bezel 20 as well as the second protrusion 42. In one embodiment, the display panel 121 is less likely to down-warp when being pressed.

In an embodiment, along the first direction, a length of the supporting platform 21 is 1 mm, the distance f ranges from 0.8 mm to 0.9 mm, and the distance ranges from 0.1 mm to 0.2 mm. The present disclosure is not limited thereto, and one embodiment may depend on an actual situation.

Figure 41:
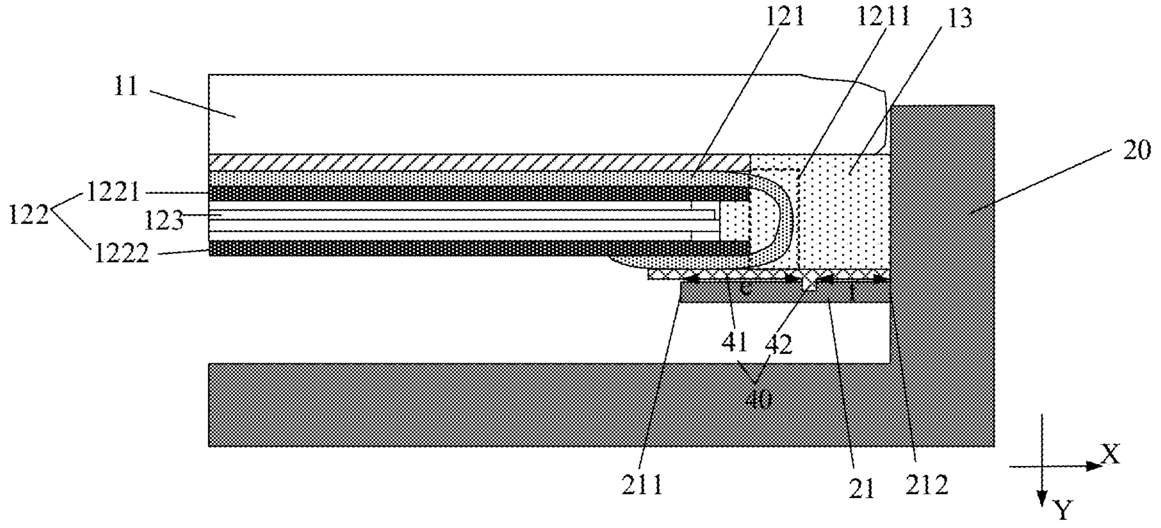
FIG. 41 is a schematic sectional view of a part of a display device according to another embodiment of the present disclosure.

In another embodiment, as shown in FIG. 41, the supporting platform 21 has with a first terminal 212 and a second terminal 211. The first end 212 of the supporting platform 21 is close to the middle frame bezel 20, and the second end 211 of the supporting platform 21 is away from the middle frame bezel 20. A distance f between the second protrusion 42 and the first end 212 of the supporting platform 21 is smaller than a distance e between the second protrusion 42 and the second end 211 of the supporting platform 21. In one embodiment, the second protrusion 42 is located in a portion of the main body 41 close to the middle frame bezel 20. In other embodiments, the distance f may be equal to the distance e. The present disclosure is not limited thereto, and one embodiment may depend on an actual situation.

In an embodiment, as shown in FIG. 40, the bending portion 1211 is located between the middle frame bezel 20 and the second protrusion 42 along the first direction X. That is, the bending portion 1211 is located between the connecting point, which is between the main body 41 and the middle frame bezel 20, and the second protrusion 42. The robustness of the bending portion along the thickness direction Y is improved. The present disclosure is not limited thereto, and one embodiment may depend on an actual situation.

Figure 42:
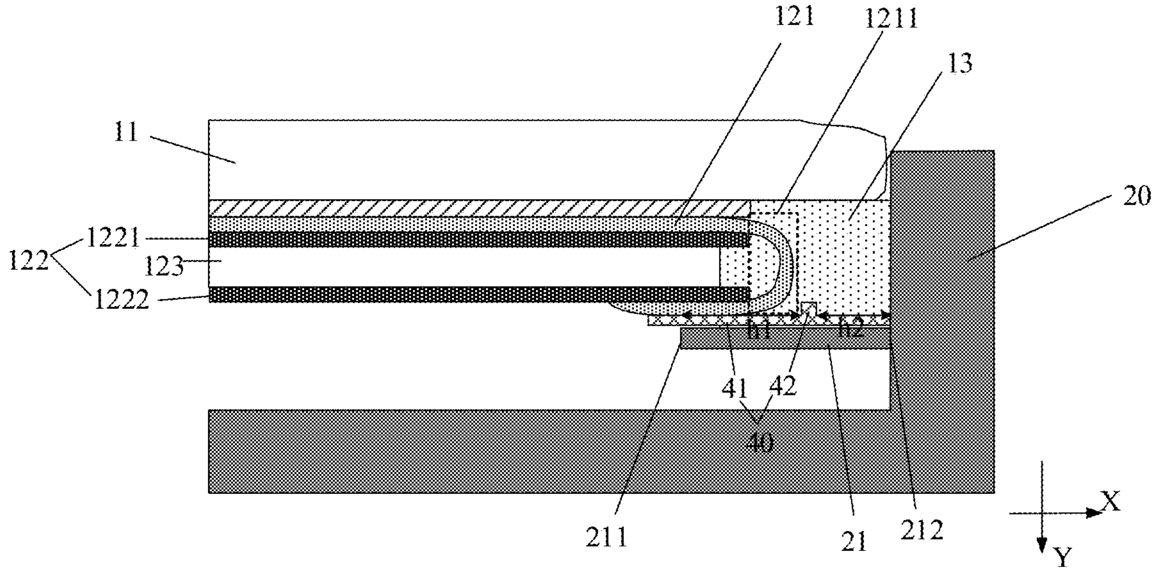
FIG. 42 is a schematic sectional view of a part of a display device according to another embodiment of the present disclosure.

In another embodiment, as shown in FIG. 42, the connecting plate 40 includes a main body 41 and at least one second protrusion 42 on a surface of the main body 41, and the second protrusion 42 protrudes in a direction towards the cover plate 11. In one embodiment, a fixed connection between the connecting plate 40 and the encapsulating layer 13 is strengthened via the second protrusion 42.

In the foregoing embodiment, the second protrusion 42 may snap directly into the encapsulating layer 13, and a structure of the display device is simplified. The present disclosure is not limited thereto. In another embodiment, the second protrusion 42 may snap indirectly into the encapsulating layer. One embodiment may depend on an actual situation.

In an embodiment, as shown in FIG. 42, the supporting platform 21 has a first end 212 and a second end 211. The first end 212 of the supporting platform 21 is close to the middle frame bezel 20, and the second end 211 of the supporting platform 21 is away from the middle frame bezel 20. A distance h2 between the second protrusion 42 and the first end 212 of the supporting platform 21 is smaller than a distance h1 between the second protrusion 42 and the second end 211 of the supporting platform 21. In one embodiment, the second protrusion 42 is located in a portion of the main body 41 close to the middle frame bezel 20, which protects the bending portion 1211 against damages due to the second protrusion 42 snapping into the encapsulating layer 13.

In an embodiment, a ratio of the distance h1 to the distance h2 ranges from 1 to 5. That is, the second protrusion 42 is located in a region of the main body 41 close to the middle frame bezel 20. The bending portion 1211 is protected against damages due to the second protrusion 42 snapping into the encapsulating layer 13.

Figure 43:
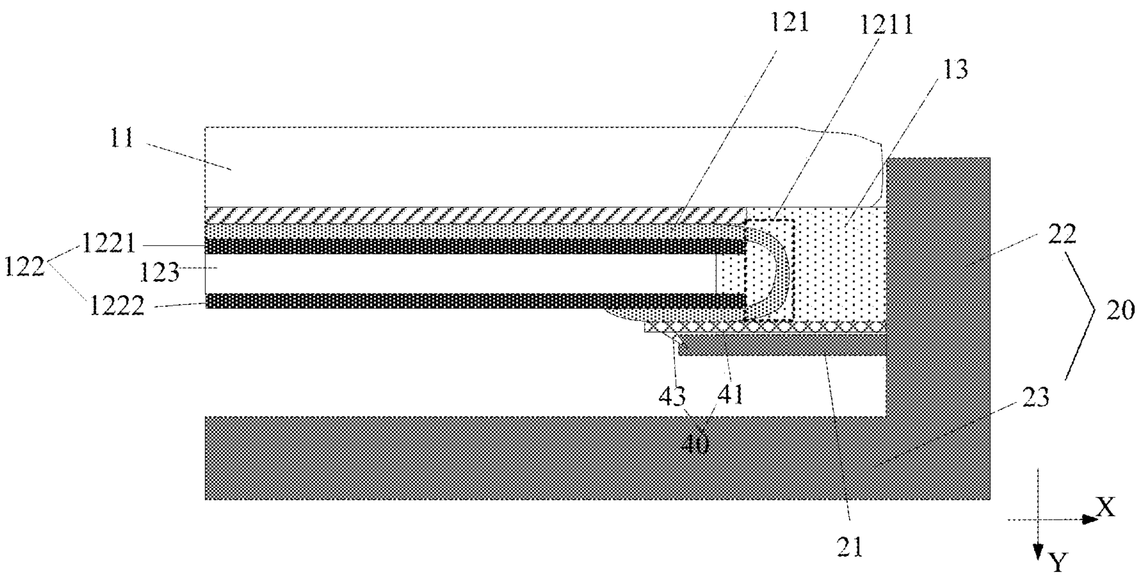
FIG. 43 is a schematic sectional view of a part of a display device according to another embodiment of the present disclosure.

In another embodiment, as shown in FIG. 43, the connecting plate 40 includes a main body 41 and at least one third protrusion 43 disposed on the main body 41, a recess is provided at a side surface of the supporting platform 21 facing away from the middle frame bezel 20, and at least a part of the third protrusion 43 snaps into the recess. In one embodiment, the third protrusion 43 on the connecting plate 40 dips into the supporting platform 21 at the side surface of the supporting platform 21, which achieves a fixed connection between connecting plate 40 and the supporting platform 21.

Figure 44:
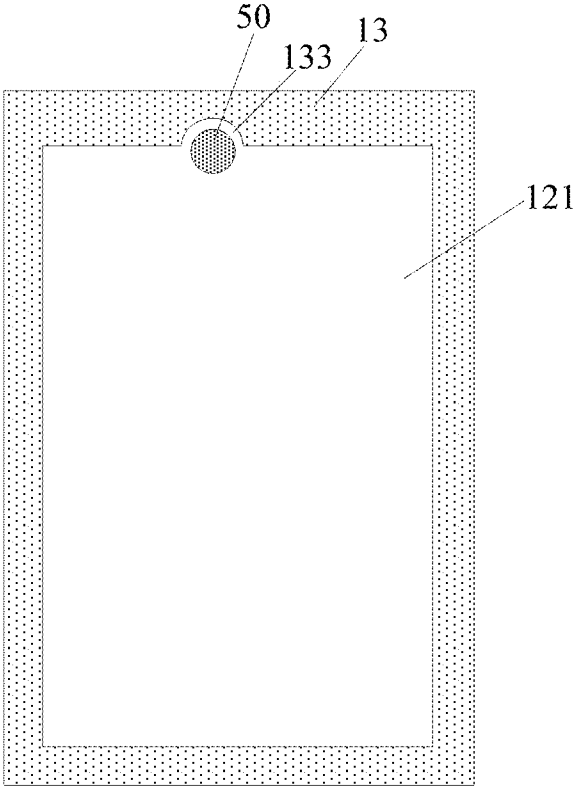
FIG. 44 is a schematic top view of a display device according to an embodiment of the present disclosure.

In an embodiment, as shown in FIG. 44, the display panel 121 includes a sensing region 50, the encapsulating layer 13 is disposed on at least a part of the periphery of the display panel 121, and the encapsulating layer 13 has at least one indent 133 at a position of corresponding to the sensing region 50. In one embodiment, a jig for fabricating the encapsulating layer 13 would not press the sensing region 50 during manufacture, which prevents components in the sensing region 50 from being damaged.

Figure 45:
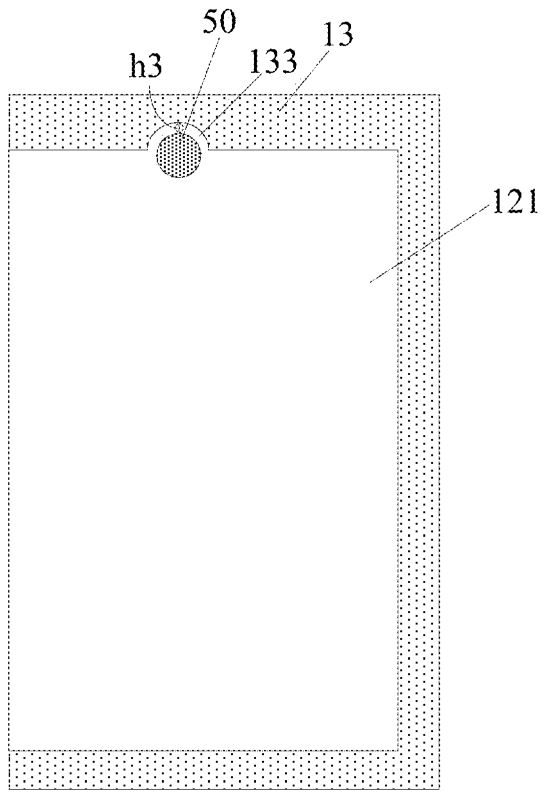
FIG. 45 is a schematic top view of a display device according to another embodiment of the present disclosure.

In the foregoing embodiments, the encapsulating layer 13 may surround the display panel 121 along the whole peripheral, as shown in FIG. 44, or may cover only a part of the peripheral of the display panel 121, as shown in FIG. 45, which is not limited herein and may depend on an actual situation.

In an embodiment, devices such as a light sensor and a camera is disposed in the sensing region of the display panel. The light sensor may include a visible light sensor, an infrared light sensor, or the like, which is not limited herein and may depend on an actual situation.

In an embodiment, as shown in FIG. 38, the composite layer 123 is located at a side of the supporting layer 122 away from the cover plate 11. In an embodiment, the supporting layer 122 includes a first supporting layer 1221 and a second supporting layer 1222. The first supporting layer 1221 is disposed at a side of the first panel portion 1212 away from the cover plate 11, the second supporting layer 1222 is disposed at a side of the second panel portion 1213 facing the cover plate 11, and the composite layer 123 is located between the first supporting layer 1221 and the second supporting layer 1222.

Figure 46:
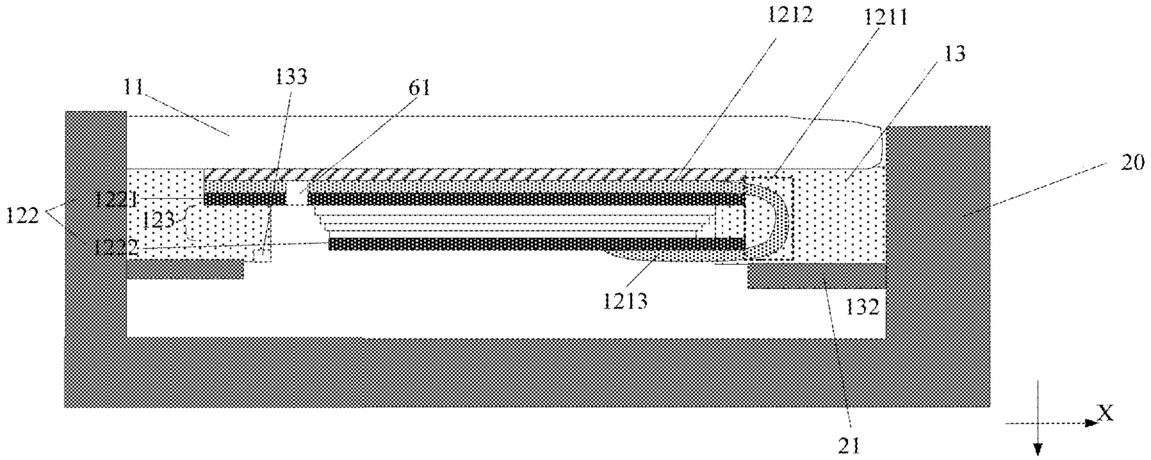
FIG. 46 is a schematic sectional view of a part of a display device according to another embodiment of the present disclosure.

In an embodiment, as shown in FIG. 46, a first opening 61 is provided in at least one layer in the display panel 121 and the supporting layer 122, and is disposed in the sensing region 50. In one embodiment, the display panel 121 and the supporting layer 122 would not obstruct a light path of the sensing region, and hence signal collection of the sensing region would not be hampered by the display panel 121 and the supporting layer 122.

Figure 47:
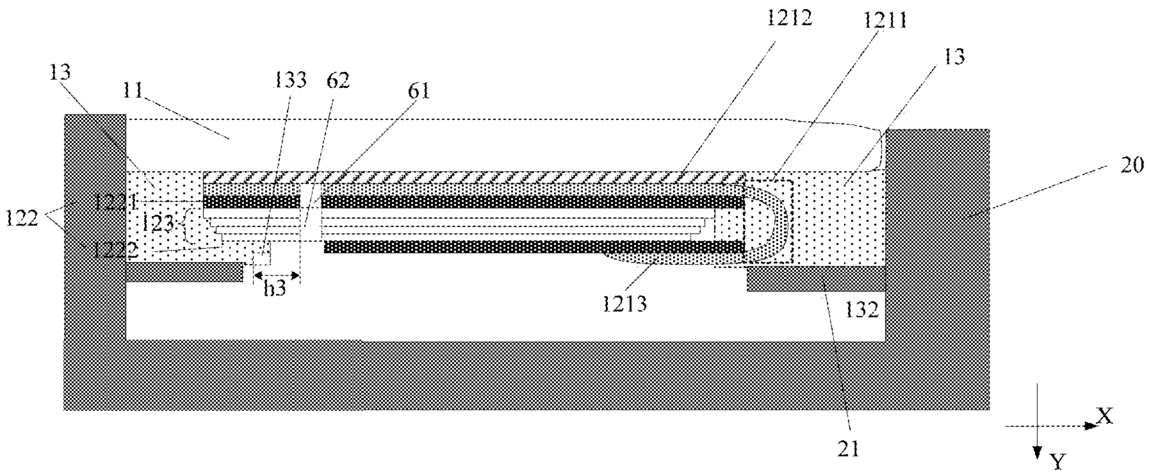
FIG. 47 is a schematic sectional view of a part of a display device according to another embodiment of the present disclosure.

In another embodiment, at least one functional layer of the composite layer overlaps with the sensing region when viewed along the thickness direction Y. In an embodiment, as shown in FIG. 47, a second opening 62 is provided in at least one functional layer of the composite layer 123, and is disposed in the sensing region 50. In one embodiment, the composite layer 123 would not obstruct a light path of the sensing region.

In another embodiment, as shown in FIG. 47, a first opening 61 is provided in at least one layer in the display panel 121 and the supporting layer 122, a second opening 62 is provided in at least one functional layer of the composite layer 123, and the first opening 61 and the second opening 62 are both disposed in the sensing region 50. In one embodiment, the display panel 121, the supporting platform 122, and the composite layer 123 would not obstruct a light path of the sensing region.

In an embodiment, the sensing region is disposed in an upper part of the border region of the display device. In one embodiment, the sensing region has a good light collection field. The present disclosure is not limited thereto, and one embodiment may depend on an actual situation.

In the foregoing embodiments, as shown in FIG. 47, at least a part of the encapsulating layer 13 may be disposed a side of the composite layer 123 away from the cover plate 11. In an embodiment, as shown in FIGS. 44 and 46, the indent 133 is spaced apart from the first opening 61 and/or the second opening 62 by a fourth distance h3. In one embodiment, there is a gap between the indent 133 and the first opening 61 and/or the second opening 62. The jig for fabricating the encapsulating layer 13 is prevented from pressing the sensing region 50 due to a processing error during manufacture, and hence the components located in the sensing region 50 are protected from damages.

In an embodiment, the fourth distance ranges from 1.0 mm to 2.0 mm. In one embodiment, the fourth distance is neither too small, in which case the jig for fabricating the encapsulating layer 13 is highly likely to press the sensing region 50 due to the processing error and damage the components in the sensing region 50, nor too large, in which an oversized upper portion of the border region of the display panel hampers user experience.

In an embodiment, the fourth distance ranges from 1.3 mm to 1.5 mm. In one embodiment, the upper portion of the border region further shrinks while preventing the jig for fabricating the encapsulating layer 13 from pressing into the sensing region 50 and damaging the components in the sensing region 50.

In an embodiment, a diameter of the first opening is smaller than a diameter of the second opening. In one embodiment, it is less difficult to align the first opening and the second opening, and it is ensured that all light passing through the first opening would pass through the second opening. The present disclosure is not limited thereto, and one embodiment may depend on an actual situation.

In an embodiment, a shape of the indent 133 includes at least one of a rectangle, a semicircle, or an arc. That is, the indent has a regular pattern while leaving a space for the sensing region, which reduces difficulties in processing the indent. The present disclosure is not limited thereto. In another embodiment, the indent may have another shape. One embodiment may depend on an actual situation, as long as the indent can leave a space for the sensing region.

In an embodiment, as shown in FIG. 43, the middle frame bezel includes a lateral bezel 22 and a bottom bezel 23. The lateral bezel 22 is located at a side of the encapsulating layer 13 away from the bending portion 1211, and the bottom bezel 23 is located at a side of the supporting platform 21 away from the cover plate 11. In an embodiment, at least a part of the supporting platform 21 is located at a side of the lateral bezel 22 facing the display panel 121.

Figure 48:
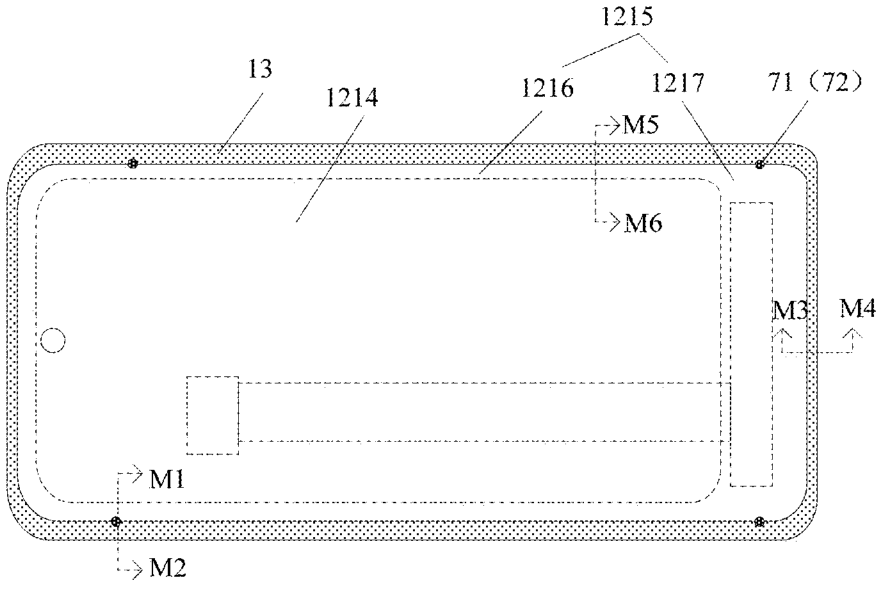
FIG. 48 is a schematic top view of a display device according to another embodiment of the present disclosure.

In an embodiment, as shown in FIG. 48, the display panel includes a display region 1214 and the border region 1215. The border region 1215 includes a non-step region 1216 and a step region 1217, the bending portion 1211 is disposed in the step region 1217, and the non-step region 1216 includes at least one molding injection region 71 and a corresponding molding ejection region 72. In an embodiment, the non-step region 1216 is includes four molding injection regions 71 and the corresponding ejection molding region(s) 72. The present disclosure is not limited thereto, and one embodiment may depend on an actual situation.

Figure 49:
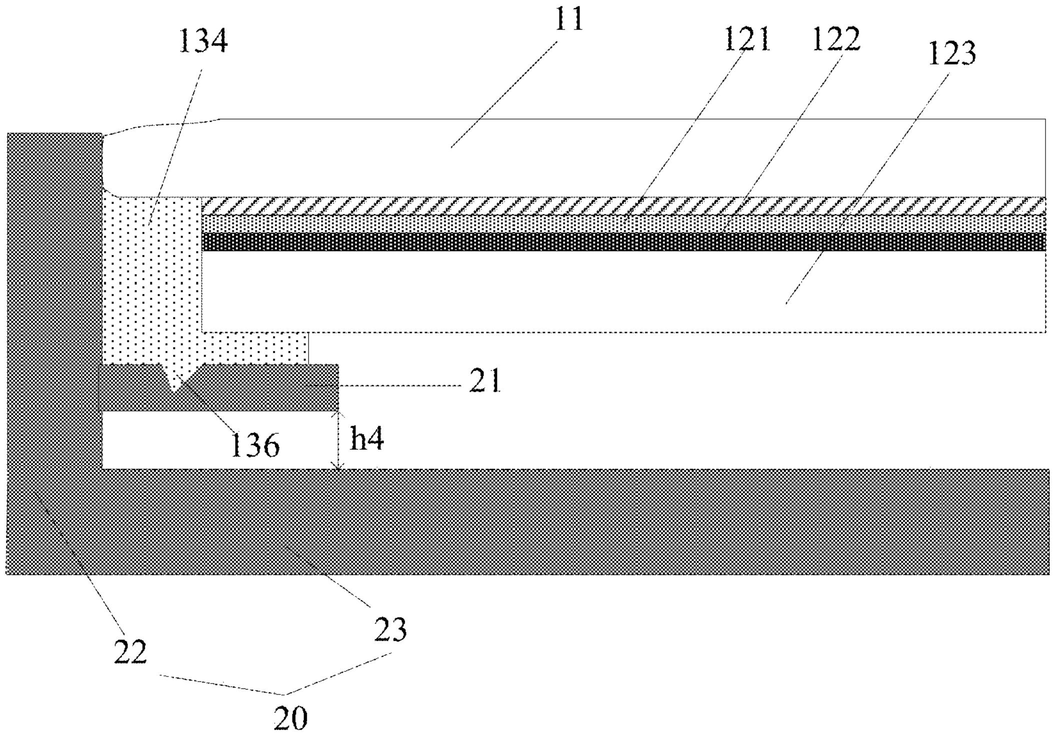
FIG. 49 is a schematic sectional view of a part of a display device according to another embodiment of the present disclosure.

Reference is made to FIG. 49, which a sectional view of a structure as shown in FIG. 48 along line M1-M2. In an embodiment, the supporting platform 21 is disposed in the molding injection region 71 or the molding ejection region 72. In one embodiment, the supporting platform can have a small dimension while supporting the display component, given that the display component is mounted on the middle frame bezel 20 in an overlapping manner. The present disclosure is not limited thereto, and one embodiment may depend on an actual situation.

Figure 50:
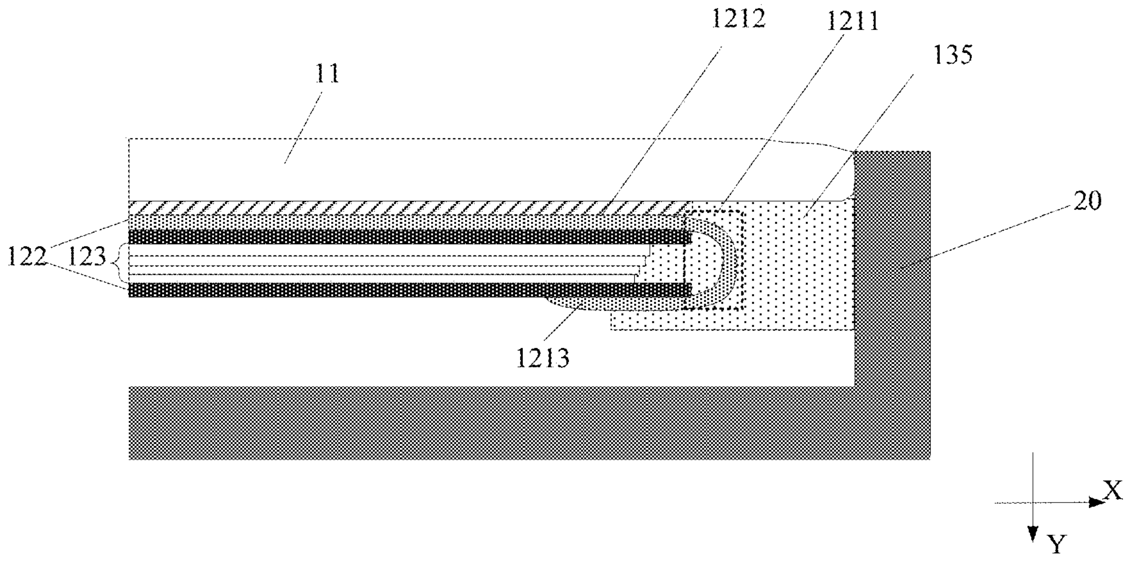
FIG. 50 is a schematic sectional view of a part of a display device according to another embodiment of the present disclosure.
Figure 51:
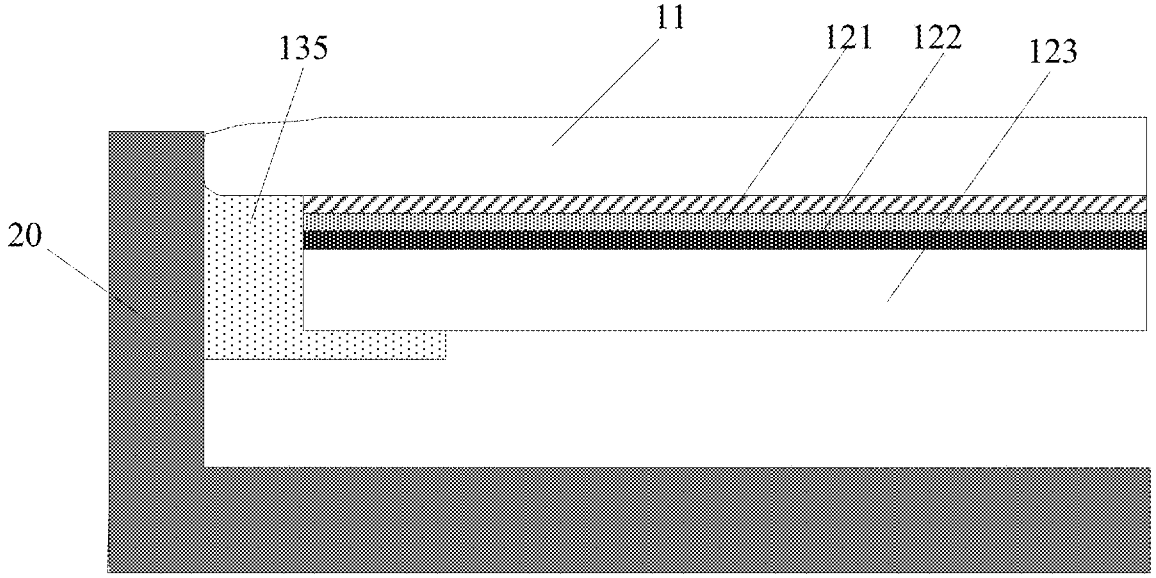
FIG. 51 is a schematic sectional view of a part of a display device according to another embodiment of the present disclosure.

Reference is made to FIGS. 48 to 51. FIG. 49 is a sectional view of a structure as shown in FIG. 48 along line M1-M2, FIG. 50 is a sectional view of the structure as shown in FIG. 48 along M3-M4, and FIG. 51 is a sectional view of the structure as shown in FIG. 48 along M5-M6. The encapsulating layer 13 includes a first encapsulating layer 134 and a second encapsulating layer 135. The first encapsulating layer 134 is disposed in the molding injection region 71 and/or the molding ejection region 72, and the second encapsulating layer 135 is disposed in the step region 1217, or another portion of the non-step bezel 1216. That is, herein the encapsulating layer 13 may be regarded as having into two parts, i.e., one part is the first encapsulating layer 134, which is disposed in the molding injection region 71 and/or the molding ejection region 72, and the other part is the second encapsulating layer 135, which is not disposed in the molding injection region 71 and/or the molding ejection region 72.

In an embodiment, as shown in FIG. 49, an injection molding protrusion 136 is disposed a side of the first encapsulating layer 134 away from the cover plate 11, the supporting platform 21 is provided with a second recess, and the injection molding protrusion 136 snaps into the second recess. Thus, when the display component is mounted on the middle frame bezel in the overlapping manner, the injection molding protrusion 136 is capable to limit a position of the display component with respect to the middle frame bezel. Additional anchoring structures are not necessary, thus simplifying a structure of the display device.

In one embodiment, the injection molding protrusion 136 snapping into the groove of the supporting platform 21 is capable to improve robustness between the encapsulating layer 13 and the supporting platform 21 through coordination of the injection molding protrusion and the groove.

In an embodiment, the second protrusion may further serves the foregoing first protrusion, which is on the encapsulating layer and protrudes in the direction away from the cover plate. In one embodiment, the structure of the display device is further simplified. The present disclosure is not limited thereto, and one embodiment may depend on an actual situation.

In an embodiment, as shown in FIG. 49, a width of a cross section of the injection molding protrusion 136 decreases gradually along a direction pointing from the cover plate 11 to the display panel 121. In one embodiment, it is convenient that the injection molding protrusion 136 snaps into the second recess of the supporting platform 21, that is, there are less difficulties for the snapping of the injection molding protrusion 136. The present disclosure is not limited thereto, and one embodiment may depend on an actual situation.

Reference is made to FIGS. 50 and 51. In an embodiment, the injection molding protrusion is disposed at a side of the second encapsulating layer 135 away from the cover plate 11, and the supporting platform is not disposed at the side of the second encapsulating layer 135 away from the cover plate 11. In one embodiment, the encapsulating layer 13 and the supporting platform 21 occupies less space inside the display device, and more space can be assigned to other structures in the display device. The present disclosure is not limited thereto. In another embodiment, a supporting platform may be disposed at the side of the second encapsulating layer 135 away from the cover plate 11, and the injection molding protrusion may be disposed at the side of the second encapsulating layer 135 away from the cover plate 11. In one embodiment, the robustness between the encapsulating layer and the supporting platform is further improved.

Figure 52:
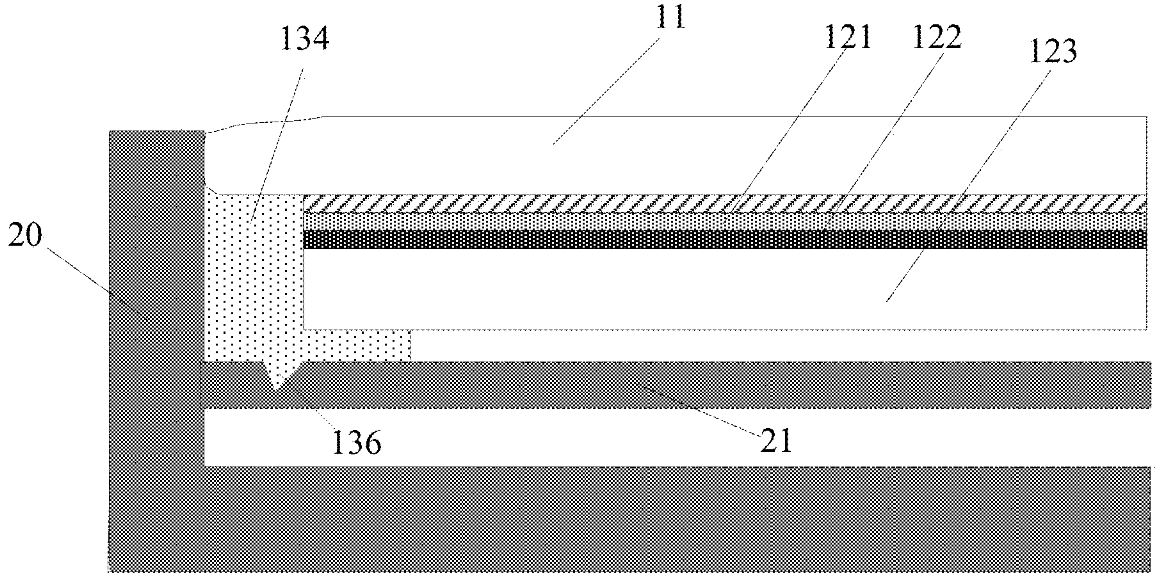
FIG. 52 is a schematic sectional view of a part of a display device according to another embodiment of the present disclosure.

In another embodiment, as shown in FIG. 52, the supporting platform may be disposed at the whole side of the encapsulating layer away from the display panel. In such case, the supporting platform may serve as a shielding plate at a non-display side of the display component. In one embodiment, signals of the display device are better protected against interferences, while the supporting platform supports the encapsulating layer and the display component. The present disclosure is not limited thereto, and one embodiment may depend on an actual situation.

In an embodiment, as shown in FIG. 49, a surface of the supporting platform 21 facing away from the cover plate is spaced apart from the bottom bezel 23 by a fifth distance h4. In one embodiment, a thickness of the supporting platform 21 is reduced to leave more internal space of the display device while ensuring support of supporting platform 21 for the encapsulating layer 13 and the display module.

In an embodiment, the fifth distance ranges h4 from 2 mm to 10 mm. In one embodiment, the fifth distance is neither too small, in which case a space between the supporting platform and the bottom bezel cannot be fully used, nor too large, in which the display device becomes thick due to the fifth distance. The present disclosure is not limited thereto, and one embodiment may depend on an actual situation.

Figure 53:
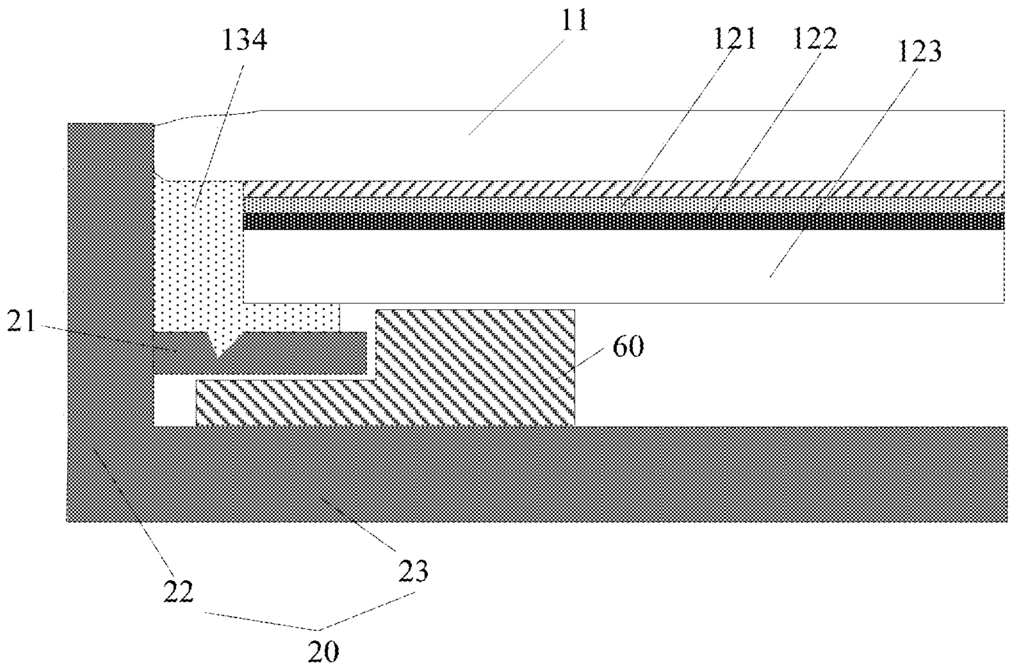
FIG. 53 is a schematic sectional view of a part of a display device according to another embodiment of the present disclosure.

Reference is made to FIG. 53. In an embodiment, the display device further includes a battery and/or a mainboard 60, which provides a driving signal and a control signal for the display device and ensures a normal operation of the display device. In an embodiment, at least a part of the battery and/or the mainboard 60 is disposed between the supporting platform 21 and the bottom bezel 23. In one embodiment, a space between the supporting platform 21 and the bottom bezel 23 is fully utilized.

Figure 54:
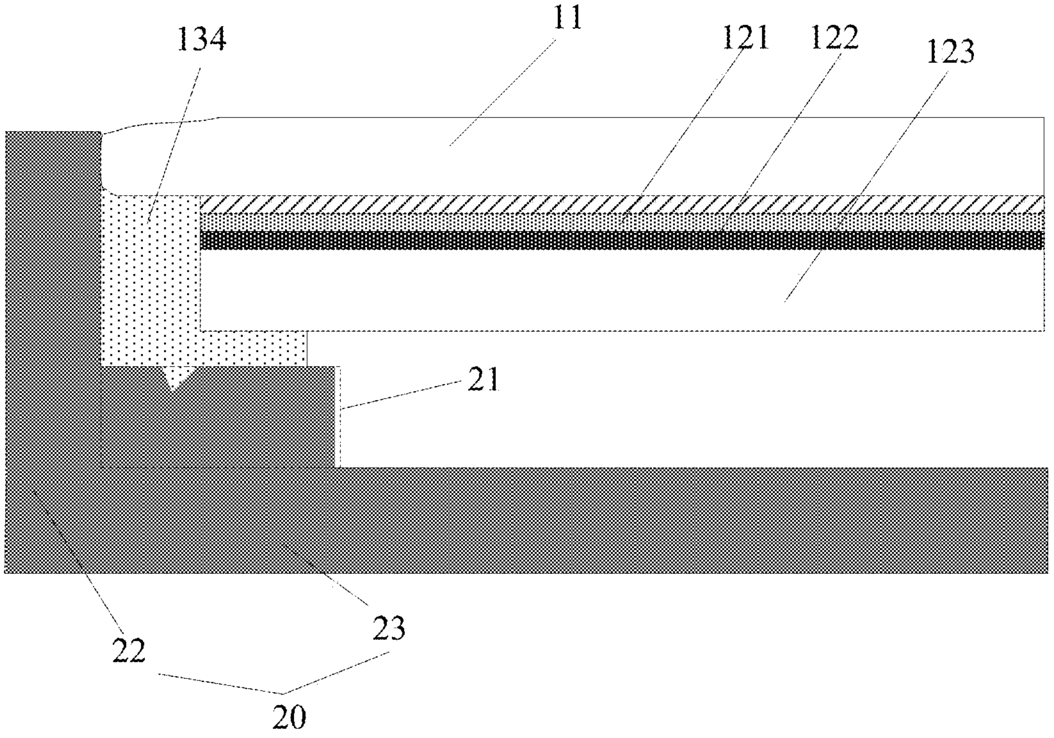
FIG. 54 is a schematic sectional view of a part of a display device according to another embodiment of the present disclosure.

In another embodiment, as shown in FIG. 54, a side of the supporting platform 21 away from the cover plate 11 is in contact with the bottom bezel 23. In one embodiment, a fixing connection between the supporting platform 21 and the middle frame bezel 20 is strengthened, which improves the robustness of the supporting platform 21 and improves the support of the supporting platform 21 for the encapsulating layer 13 and the display module. The present disclosure is not limited thereto, and one embodiment may depend on an actual situation.

Therefore, according to embodiments of the present disclosure, the supporting platform and the display module in the display device overlap with each other in the first overlapping region when viewed along the thickness direction of the cover plate. Such partial overlapping reduces a distance between an end of the display module facing the middle frame bezel and a surface of the middle frame bezel facing the display module in a plane parallel to the cover plate, and to reduce a distance between the end of the display module facing the middle frame bezel and a side surface of the middle frame bezel facing away from the display module. Thus, a border region of the display device has a smaller area in the plane parallel to the cover plate, which facilitate a narrow border in display.

Herein the terms "first", "second", "third", and "fourth" are merely descriptive, and should not be construed as indicating or implying relative importance or implicitly indicating the number of features that are referred to. Therefore, a feature defined by "first", "second", "third", or "fourth" may explicitly or implicitly include one or more corresponding objects. Herein the terms "include", "comprise", or any variant therefor are intended for non-exclusive inclusion. Therefore, a process, a method, an article, or a device including a series of elements includes not only these elements but also another element which is not enumerated, or may include an element inherent for such process, method, article or device. Unless explicitly limited otherwise, a process, a method, an article, or a device limited by "comprising/including a(n) . . . " does not exclude inclusion of another identical element in such process, method, article or device.

The invention claimed is:

1. A display device, comprising:
a display component comprising a cover plate, a display module, and an encapsulating layer, wherein:
the cover plate has a light emitting side and a backlight side, the display module and at least a part of the encapsulating layer is disposed at the backlight side of the cover plate;
the encapsulating layer covers at least a part of a periphery of the display module;
the display module comprises a display panel, a supporting layer, and a composite layer that are stacked;
the composite layer comprises a plurality of functional layers; and
the display panel comprises a bending portion at a side of the display panel along a first direction, and the first direction is parallel with a plane along which the cover plate extends; and
a middle frame bezel, wherein:
a supporting platform is disposed on at least a part of a periphery of the middle frame bezel and is configured to support the display module;
the supporting platform is located at a side of the display module away from the cover plate; and
the supporting platform and the display module overlap in a first overlapping region when viewed along a thickness direction of the cover plate,
wherein the display panel comprises a sensing region, and the encapsulating layer has at least one indent at a position corresponding to the sensing region, wherein the composite layer is disposed at a side of the supporting layer away from the cover plate; there is one or both of a first opening and a second opening, wherein the first opening runs at least partially through the display panel and the supporting layer, the second opening runs through at least a part of the plurality of functional layers, and the first opening and the second opening each is in the sensing region; at least a part of the encapsulating layer is disposed at a side of the composite layer away from the cover plate; the at least one indent is spaced apart from the one or both of the first opening and the second opening by a fourth distance;
or,
wherein the middle frame bezel comprises a lateral bezel and a bottom bezel, the lateral bezel is disposed at a side of the encapsulating layer away from the bending portion, and the bottom bezel is disposed at a side of the supporting platform away from the cover plate; and
at least a part of the supporting platform is located at a side of the lateral bezel close to the display panel,
wherein the display panel comprises a display region and a border region, and the border region comprises a non-step region and a step region;
the bending portion is disposed in the step region;
the non-step region comprises at least one molding injection region and a molding ejection region corresponding to the at least one molding injection region; and
the supporting platform is disposed in one or both of at least one molding injection region and the molding ejection region.

2. The display device according to claim 1, wherein the supporting platform and at least one functional layer among the plurality of functional layers overlap in a second overlapping region when viewed along the thickness direction.

3. The display device according to claim 1, wherein the supporting platform and at least two functional layers among the plurality of functional layers overlap partially when viewed along the thickness direction.

4. The display device according to claim 1, wherein along the first direction, the bending portion is located between the middle frame bezel and a terminal of the supporting platform away from the middle frame bezel.

5. The display device according to claim 4, wherein along the first direction, the bending portion comprises an arc top, and a distance between the arc top and a side surface of the middle frame bezel facing the bending portion is smaller than a distance between the arc top and the terminal.

6. The display device according to claim 4, wherein along the first direction, the bending portion comprises an arc top, and a distance between the arc top and a side surface of the middle frame bezel facing the bending portion is greater than a distance between the arc top and the terminal.

7. The display device according to claim 1, wherein the composite layer comprises at least one of: a metal layer, an adhesive layer, a copper foil, a foam layer, or a graphite layer.

8. The display device according to claim 1, wherein along the first direction, a length of the first overlapping region is not less than 0.5 mm.

9. The display device according to claim 1, wherein along the first direction, a length of the supporting platform is not less than 0.8 mm.

10. The display device according to claim 1, wherein along the first direction, a ratio of a length of the first overlapping region to a length of the supporting platform ranges from 0.15 to 0.3.

11. The display device according to claim 1, wherein the bending portion comprises an arc top, the arc top and the middle frame bezel are spaced apart by a first distance along the first direction, and the first distance ranges from 0.3 mm to 0.6 mm.

12. The display device according to claim 1, wherein a side surface of the encapsulating layer facing away from the bending portion is attached to a side surface of the middle frame bezel facing the bending portion.

13. The display device according to claim 12, wherein at least one reinforcing member is disposed at the side surface the middle frame bezel facing the bending portion, and each of the at least one reinforcing member is a protrusion or a recess.

14. The display device according to claim 12, wherein the side surface of the encapsulating layer facing away from the bending portion comprises an inclined surface, and there is a first included angle between the inclined surface and the surface of the middle frame bezel facing the bending portion.

15. The display device according to claim 14, wherein a caulking member is disposed between the middle frame bezel and the inclined surface.

16. The display device according to claim 14, wherein the first included angle ranges from 5° to 15°.

17. The display device according to claim 1, wherein one or more holes and/or particles are disposed in the encapsulating layer.

18. The display device according to claim 17, wherein a density of the one or more holes in the encapsulating layer decreases gradually along a direction pointing from the bending portion towards the middle frame bezel.

19. The display device according to claim 17, wherein the one or more holes are distributed uniformly along the direction pointing from the bending portion towards the middle frame bezel.

20. The display device according to claim 1, wherein:

the display panel further comprises a first panel portion and a second panel portion;

the bending portion extends along a curving direction, and two terminals of the bending portion along the curving direction are connected to the first panel portion and the second panel portion, respectively; and the first panel portion is closer to the cover plate than the second panel portion, and the supporting layer is located between the first panel portion and the second panel portion.

21. The display device according to claim 20, wherein one or both of a padding and an inner support are disposed at a concave side of the bending portion, the padding and the encapsulating layer are identical in material, and the padding and the encapsulating layer are different in material.

22. The display device according to claim 21, wherein a side surface of one of the padding and the inner support facing the middle frame bezel abuts against the bending portion at the concave side, and another side surface of the one of the padding and the inner support facing away from the middle frame bezel abuts against a side surface of the supporting layer.

23. The display device according to claim 21, wherein a side surface of one of the padding and the inner support facing the middle frame bezel abuts against the bending portion at the concave side, and another side surface of the one of the padding and the inner support facing away from the middle frame bezel is spaced apart from a side surface of the supporting layer by a second distance.

24. The display device according to claim 21, wherein both the padding and an inner support are disposed at the concave side of the bending portion, the padding and the inner support are arranged sequentially along a first direction perpendicular to the thickness direction.

25. The display device according to claim 21, wherein both the padding and an inner support are disposed at the concave side of the bending portion, the padding and the inner support are arranged sequentially along the thickness direction.

26. The display device according to claim 20, wherein:

the supporting layer comprises a first supporting layer and a second supporting layer;

the first supporting layer is disposed at a side of the first panel portion away from the cover plate, and the second supporting layer is disposed at a side of the second panel portion facing the cover plate; and a first terminal of the first supporting layer close to the bending portion and a second terminal of the second supporting layer close to the bending portion are not aligned when viewed along the thickness direction.

27. The display device according to claim 26, wherein the bending portion comprises an arc top, and the first terminal is closer to the arc top than the second terminal.

28. The display device according to claim 27, wherein:

the bending portion comprises a first bending section and a second bending section;

the first bending section is connected to the first panel portion, and the second bending section is connected to the second panel portion; and a radius of curvature of the first bending section is different from a radius of curvature of the second bending section.

29. The display device according to claim 28, wherein the radius of curvature of the first bending section is smaller than the radius of curvature of the second bending section.

30. The display device according to claim 29, wherein the radius of curvature of the first bending section ranges 0.05 mm to 0.2 mm, and the radius of curvature of the second bending section ranges from 0.15 mm to 0.3 mm.

31. The display device according to claim 1, wherein at least one first protrusion is disposed at a side surface of the encapsulating layer facing away from the cover plate, a first recess is provided at a side surface of the supporting platform facing the cover plate, and at least a part of the first protrusion snaps into the first recess.

32. The display device according to claim 20, further comprising a connecting plate disposed at a side of the second panel portion away from the cover plate, wherein a portion of the connecting plate is inserted into the encapsulating layer.

33. The display device according to claim 32, wherein the connecting plate comprises:

a main body; and a second protrusion disposed at a surface of the main body, wherein the second protrusion snaps into the supporting platform.

34. The display device according to claim 33, wherein the second protrusion and the encapsulating layer overlap at least partially when viewed along the thickness direction of the cover plate, and at least a part of the second protrusion is disposed in the encapsulating layer.

35. The display device according to claim 33, wherein the second protrusion and the encapsulating layer do not overlap when viewed along the thickness direction of the cover plate.

36. The display device according to claim 35, wherein along the first direction, the second protrusion is spaced apart from the encapsulating layer by a third distance ranging from 0.1 mm to 0.5 mm.

37. The display device according to claim 33, wherein the second protrusion overlap at least partially with at least two functional layers of the plurality of functional layers when viewed along the thickness direction.

38. The display device according to claim 33, wherein a distance between the second protrusion and a first terminal of the supporting platform close to the middle frame bezel is greater than a distance between the second protrusion and a second terminal of the supporting platform away from the middle frame bezel.

39. The display device according to claim 38, wherein a ratio of the distance between the second protrusion and the first terminal to the distance between the second protrusion and the second terminal ranges from 5 to 8.

40. The display device according to claim 33, wherein along the first direction, the bending portion is located between the middle frame bezel and the second protrusion.

41. The display device according to claim 32, wherein the connecting plate comprises:

a main body; and a third protrusion disposed on the main body;

wherein a recess is provided at a side surface of the supporting platform facing away from the middle frame bezel, and at least a part of the third protrusion is snapped into the recess.

42. The display device according to claim 1, wherein a diameter of the first opening is smaller than a diameter of the second opening.

43. The display device according to claim 1, wherein a shape of each of the at least one indent comprises a rectangle, a semicircle, or an arc.

44. The display device according to claim 1, wherein:

the encapsulating layer comprises a first encapsulating layer and a second encapsulating layer;

the first encapsulating layer is disposed in one or both of at least one molding injection region and the molding ejection region; and the second encapsulating layer is disposed in the step region, or disposed in the non-step region other than the at least one molding injection region and the molding ejection region.

45. The display device according to claim 44, wherein an injection molding protrusion is disposed a surface of the first encapsulating layer facing away from the cover plate, the supporting platform is provided with a second recess, and the injection molding protrusion snaps into a groove.

46. The display device according to claim 45, wherein a width of a cross section of the injection molding protrusion decreases gradually along a direction pointing from the cover plate to the display panel.

47. The display device according to claim 44, wherein no injection molding protrusion is arranged at a surface of the second encapsulating layer facing away from the cover plate, and the supporting platform is not disposed at a side of the second encapsulating layer away from the cover plate.

48. The display device according to claim 1, wherein a surface of the supporting platform facing away from the cover plate is spaced apart from the bottom bezel by a fifth distance.

49. The display device according to claim 48, further comprising:

one or both of a battery and a mainboard, wherein at least a part of the one or both of the battery and the mainboard is disposed between the supporting platform and the bottom bezel.

50. The display device according to claim 1, wherein a surface of the supporting platform facing away from the cover plate is in contact with the bottom bezel.

* * * * *